United States Patent
Todd

(10) Patent No.: US 8,067,297 B2
(45) Date of Patent: Nov. 29, 2011

(54) PROCESS FOR DEPOSITION OF SEMICONDUCTOR FILMS

(75) Inventor: Michael A. Todd, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 103 days.

(21) Appl. No.: 11/642,167

(22) Filed: Dec. 20, 2006

(65) Prior Publication Data
US 2007/0102790 A1    May 10, 2007

Related U.S. Application Data

(60) Division of application No. 11/124,340, filed on May 6, 2005, now Pat. No. 7,186,582, which is a continuation of application No. 10/074,534, filed on Feb. 11, 2002, now Pat. No. 6,958,253.

(60) Provisional application No. 60/268,337, filed on Feb. 12, 2001, provisional application No. 60/279,256, filed on Mar. 27, 2001, provisional application No. 60/311,609, filed on Aug. 9, 2001, provisional application No. 60/323,649, filed on Sep. 19, 2001, provisional application No. 60/332,696, filed on Nov. 13, 2001, provisional application No. 60/333,724, filed on Jul. 28, 2001, provisional application No. 60/340,454, filed on Dec. 7, 2001.

(51) Int. Cl.
*H01L 21/20* (2006.01)

(52) U.S. Cl. ........ 438/478; 438/503; 438/507; 438/603; 438/680; 257/E21.09

(58) Field of Classification Search ............ 257/65, 257/64, 66, 52, 637; 427/255, 255.35; 438/933, 438/478, 503, 507, 603, 680
See application file for complete search history.

(56) References Cited

U.S. PATENT DOCUMENTS

| | | | |
|---|---|---|---|
| 3,900,597 A | 8/1975 | Chruma et al. |
| 4,118,539 A | 10/1978 | Hirai et al. |
| 4,200,666 A | 4/1980 | Reinberg |
| 4,217,374 A | 8/1980 | Ovshinsky et al. |
| 4,223,048 A | 9/1980 | Engle |
| 4,237,150 A | 12/1980 | Wiesmann |
| 4,363,828 A | 12/1982 | Brodsky et al. |
| 4,379,020 A | 4/1983 | Glaeser et al. |

(Continued)

FOREIGN PATENT DOCUMENTS

EP    0 233613 A2    2/1987

(Continued)

OTHER PUBLICATIONS

Ikoma et al., Growth of Si/3C-SiC/Si(100) hetrostructures by pulsed supersonic free jets, Applied Physics Letters, vol. 75, No. 25, pp. 3977-3979, Dec. 1999.

(Continued)

*Primary Examiner* — Wai Sing Louie
(74) *Attorney, Agent, or Firm* — Knobbe Martens Olson & Bear LLP

(57) ABSTRACT

Chemical vapor deposition processes utilize higher order silanes and germanium precursors as chemical precursors. The processes have high deposition rates yet produce more uniform films, both compositionally and in thickness, than films prepared using conventional chemical precursors. In preferred embodiments, trisilane is employed to deposit SiGe-containing films that are useful in the semiconductor industry in various applications such as transistor gate electrodes.

15 Claims, 16 Drawing Sheets

U.S. PATENT DOCUMENTS

| | | | |
|---|---|---|---|
| 4,444,812 A | 4/1984 | Gutsche | |
| 4,452,875 A | 6/1984 | Ogawa et al. | |
| 4,481,229 A | 11/1984 | Suzuki et al. | |
| 4,495,218 A | 1/1985 | Azuma et al. | |
| 4,557,794 A | 12/1985 | McGinn et al. | |
| 4,578,142 A | 3/1986 | Corboy, Jr. et al. | |
| 4,585,671 A | 4/1986 | Kitagawa et al. | |
| 4,592,933 A | 6/1986 | Meyerson et al. | |
| 4,615,762 A | 10/1986 | Jastrzebski et al. | |
| 4,631,804 A | 12/1986 | Roy | |
| 4,634,605 A | 1/1987 | Wiesmann | |
| 4,684,542 A | 8/1987 | Jasinski et al. | |
| 4,695,331 A | 9/1987 | Ramaprasad | |
| 4,707,197 A | 11/1987 | Hensel et al. | |
| 4,720,395 A | 1/1988 | Foster | |
| 4,737,379 A | 4/1988 | Hudgens et al. | |
| 4,745,088 A | 5/1988 | Inoue et al. | |
| 4,755,481 A | 7/1988 | Faraone | |
| 4,854,263 A | 8/1989 | Chang et al. | |
| 4,871,416 A | 10/1989 | Fukuda | |
| 4,891,092 A | 1/1990 | Jastrzebski | |
| 4,894,352 A | 1/1990 | Lane et al. | |
| 4,902,645 A | 2/1990 | Ohba | |
| 4,933,206 A | 6/1990 | Cox | |
| 4,963,506 A | 10/1990 | Liaw et al. | |
| 4,966,861 A | 10/1990 | Mieno et al. | |
| 4,992,299 A | 2/1991 | Hochberg et al. | |
| 5,037,666 A | 8/1991 | Mori | |
| 5,068,124 A | 11/1991 | Batey et al. | |
| 5,080,933 A | 1/1992 | Grupen-Shemansky et al. | |
| 5,082,696 A | 1/1992 | Sharp | |
| 5,091,761 A | 2/1992 | Hiraiwa et al. | |
| 5,110,757 A | 5/1992 | Arst et al. | |
| 5,112,773 A | 5/1992 | Tuttle | |
| 5,192,714 A | 3/1993 | Suguro et al. | |
| 5,194,398 A | 3/1993 | Miyachi et al. | |
| 5,198,387 A | 3/1993 | Tang | |
| 5,214,002 A | 5/1993 | Hayashi et al. | |
| 5,227,329 A | 7/1993 | Kobayashi et al. | |
| 5,231,056 A | 7/1993 | Sandhu | |
| 5,234,609 A | 8/1993 | Kashida et al. | |
| 5,242,847 A | 9/1993 | Ozturk et al. | |
| 5,250,452 A | 10/1993 | Ozturk et al. | |
| 5,324,684 A | 6/1994 | Kermani et al. | |
| 5,326,649 A | 7/1994 | Kashida et al. | |
| 5,356,821 A | 10/1994 | Naruse et al. | |
| 5,385,863 A | 1/1995 | Tatsumi et al. | |
| 5,389,398 A | 2/1995 | Suzuki et al. | |
| 5,389,570 A | 2/1995 | Shiozawa | |
| 5,453,858 A | 9/1995 | Yamazaki | |
| 5,461,250 A | 10/1995 | Burghartz et al. | |
| 5,471,330 A | 11/1995 | Sarma | |
| 5,504,704 A | 4/1996 | Sato et al. | |
| 5,508,067 A | 4/1996 | Sato et al. | |
| 5,510,146 A | 4/1996 | Miyasaka | |
| 5,540,785 A * | 7/1996 | Dennard et al. | 148/33.2 |
| 5,563,093 A | 10/1996 | Koda et al. | |
| 5,582,640 A | 12/1996 | Okada et al. | |
| 5,587,344 A | 12/1996 | Ishikawa | |
| 5,591,494 A | 1/1997 | Sato et al. | |
| 5,607,724 A | 3/1997 | Beinglass et al. | |
| 5,614,257 A | 3/1997 | Beinglass et al. | |
| 5,616,754 A | 4/1997 | Cruse et al. | |
| 5,648,293 A | 7/1997 | Hayama et al. | |
| 5,654,237 A | 8/1997 | Suguro et al. | |
| 5,656,531 A | 8/1997 | Thakur et al. | |
| 5,677,236 A | 10/1997 | Saitoh et al. | |
| 5,695,819 A | 12/1997 | Beinglass et al. | |
| 5,698,771 A | 12/1997 | Shields et al. | |
| 5,700,520 A | 12/1997 | Beinglass et al. | |
| 5,731,238 A | 3/1998 | Cavins et al. | |
| 5,763,021 A | 6/1998 | Young et al. | |
| 5,786,027 A | 7/1998 | Rolfson | |
| 5,789,030 A | 8/1998 | Rolfson | |
| 5,821,577 A * | 10/1998 | Crabbe' et al. | 257/288 |
| 5,837,580 A | 11/1998 | Thakur et al. | |
| 5,849,601 A | 12/1998 | Yamazaki | |
| 5,858,819 A | 1/1999 | Miyasaka | |
| 5,863,598 A | 1/1999 | Venkatesan et al. | |
| 5,869,389 A | 2/1999 | Ping et al. | |
| 5,874,129 A | 2/1999 | Beinglass et al. | |
| 5,876,797 A | 3/1999 | Beinglass et al. | |
| 5,879,970 A | 3/1999 | Shiota et al. | |
| 5,885,869 A | 3/1999 | Turner et al. | |
| 5,893,949 A | 4/1999 | King et al. | |
| 5,930,106 A | 7/1999 | DeBoer et al. | |
| 5,959,326 A | 9/1999 | Aiso et al. | |
| 5,969,393 A | 10/1999 | Noguchi | |
| 5,998,289 A * | 12/1999 | Sagnes | 438/592 |
| 6,013,922 A | 1/2000 | Ueda et al. | |
| 6,027,705 A | 2/2000 | Kitsuno et al. | |
| 6,027,975 A | 2/2000 | Hergenrother et al. | |
| 6,083,810 A | 7/2000 | Obeng et al. | |
| 6,090,666 A | 7/2000 | Ueda et al. | |
| 6,103,600 A | 8/2000 | Ueda et al. | |
| 6,107,147 A | 8/2000 | Kim et al. | |
| 6,121,081 A | 9/2000 | Thakur et al. | |
| 6,147,375 A | 11/2000 | Yamazaki et al. | |
| 6,150,283 A | 11/2000 | Ishiguro | |
| 6,153,541 A | 11/2000 | Yao et al. | |
| 6,159,828 A | 12/2000 | Ping et al. | |
| 6,161,498 A | 12/2000 | Toraguchi et al. | |
| 6,162,667 A | 12/2000 | Funai et al. | |
| 6,171,662 B1 | 1/2001 | Nakao | |
| 6,197,669 B1 | 3/2001 | Twu et al. | |
| 6,197,694 B1 | 3/2001 | Beinglass | |
| 6,210,988 B1 * | 4/2001 | Howe et al. | 438/50 |
| 6,228,181 B1 | 5/2001 | Yamamoto et al. | |
| 6,235,568 B1 | 5/2001 | Murthy et al. | |
| 6,252,284 B1 | 6/2001 | Muller et al. | |
| 6,252,295 B1 | 6/2001 | Cote et al. | |
| 6,274,463 B1 | 8/2001 | Chaiken | |
| 6,281,559 B1 | 8/2001 | Yu et al. | |
| 6,284,583 B1 | 9/2001 | Saido et al. | |
| 6,319,782 B1 | 11/2001 | Nakabayashi et al. | |
| 6,326,064 B1 | 12/2001 | Denison et al. | |
| 6,326,311 B1 | 12/2001 | Ueda et al. | |
| 6,346,732 B1 | 2/2002 | Mizushima et al. | |
| 6,348,373 B1 * | 2/2002 | Ma et al. | 438/240 |
| 6,365,465 B1 | 4/2002 | Chan et al. | |
| 6,365,479 B1 | 4/2002 | U'Ren | |
| 6,372,559 B1 | 4/2002 | Crowder et al. | |
| 6,373,112 B1 * | 4/2002 | Murthy et al. | 257/407 |
| 6,385,020 B1 | 5/2002 | Shin et al. | |
| 6,403,981 B1 * | 6/2002 | Yu | 257/63 |
| 6,444,495 B1 | 9/2002 | Leung et al. | |
| 6,444,512 B1 | 9/2002 | Madhukar et al. | |
| 6,448,622 B1 | 9/2002 | Franke et al. | |
| 6,455,892 B1 | 9/2002 | Okuno et al. | |
| 6,465,045 B1 | 10/2002 | Heuer et al. | |
| 6,610,361 B1 | 8/2003 | Heuer et al. | |
| 6,613,695 B2 | 9/2003 | Pomarede et al. | |
| 6,709,512 B2 | 3/2004 | Yamoto et al. | |
| 6,716,713 B2 | 4/2004 | Todd | |
| 6,716,751 B2 | 4/2004 | Todd | |
| 6,743,738 B2 | 6/2004 | Todd | |
| 6,821,825 B2 | 11/2004 | Todd | |
| 6,900,115 B2 | 5/2005 | Todd | |
| 6,958,253 B2 | 10/2005 | Todd | |
| 6,962,859 B2 | 11/2005 | Todd | |
| 7,005,160 B2 | 2/2006 | Todd | |
| 7,026,219 B2 | 4/2006 | Pomarede et al. | |
| 7,186,582 B2 | 3/2007 | Todd | |
| 7,186,630 B2 | 3/2007 | Todd | |
| 7,273,799 B2 | 9/2007 | Todd | |
| 7,285,500 B2 | 10/2007 | Todd | |
| 2002/0011612 A1 | 1/2002 | Hieda | |
| 2002/0016084 A1 | 2/2002 | Todd | |
| 2002/0036290 A1 | 3/2002 | Inaba et al. | |
| 2002/0098627 A1 | 7/2002 | Pomarede et al. | |
| 2002/0168868 A1 | 11/2002 | Todd | |
| 2002/0173130 A1 | 11/2002 | Pomarede et al. | |
| 2004/0115953 A1 | 6/2004 | Yamazaki et al. | |
| 2005/0064684 A1 | 3/2005 | Todd et al. | |
| 2005/0233529 A1 | 10/2005 | Pomarede et al. | |
| 2006/0130743 A1 | 6/2006 | Brabant et al. | |
| 2007/0102790 A1 | 5/2007 | Todd | |

| | | |
|---|---|---|
| 2007/0117359 A1 | 5/2007 | Todd |
| 2008/0014725 A1 | 1/2008 | Todd |
| 2008/0073645 A1* | 3/2008 | Todd et al. ............ 257/52 |

FOREIGN PATENT DOCUMENTS

| | | |
|---|---|---|
| EP | 0 368 651 A2 | 5/1990 |
| EP | 0368651 | 5/1990 |
| EP | 0 486 047 A2 | 11/1991 |
| EP | 0486047 | 5/1992 |
| EP | 0 747 974 A2 | 12/1996 |
| EP | 0747974 | 12/1996 |
| EP | 0 928 015 A2 | 7/1999 |
| EP | 1 065 728 A2 | 1/2001 |
| EP | 1065728 | 1/2001 |
| GB | 1307036 A | 2/1973 |
| GB | 2332564 | 6/1999 |
| GB | 2332564 A | 6/1999 |
| JP | 49-121488 | 11/1974 |
| JP | 1979-004066 | 1/1979 |
| JP | 1982-209810 | 12/1982 |
| JP | 57209810 | 12/1982 |
| JP | 1984-007918 | 5/1984 |
| JP | 1984-078919 | 5/1984 |
| JP | 59078918 | 5/1984 |
| JP | 59078919 | 5/1984 |
| JP | 1985-015967 | 1/1985 |
| JP | 1985-043485 | 3/1985 |
| JP | 60043485 | 3/1985 |
| JP | S60-43485 | 3/1985 |
| JP | 1985-257703 | 11/1985 |
| JP | 61095535 | 5/1986 |
| JP | 1986-153277 | 7/1986 |
| JP | 61153277 | 7/1986 |
| JP | 1986-194823 | 8/1986 |
| JP | 1987-076612 | 4/1987 |
| JP | 62077612 | 4/1987 |
| JP | 1987-253771 | 11/1987 |
| JP | 1988-003414 | 1/1988 |
| JP | 1988-003463 | 1/1988 |
| JP | 63003414 | 1/1988 |
| JP | 63003463 | 1/1988 |
| JP | 1988-051680 | 3/1988 |
| JP | 1988-166502 | 7/1988 |
| JP | 1989-004066 | 1/1989 |
| JP | 01-128428 | 5/1989 |
| JP | 1989-217956 | 8/1989 |
| JP | 01217956 | 8/1989 |
| JP | 1989-268064 | 10/1989 |
| JP | 01268064 | 10/1989 |
| JP | 1990-000314 | 1/1990 |
| JP | 1990-155225 | 6/1990 |
| JP | 02155225 | 6/1990 |
| JP | H 02-155225 | 6/1990 |
| JP | 1991-091239 | 4/1991 |
| JP | 03091239 | 4/1991 |
| JP | H3-91239 | 4/1991 |
| JP | 1991-185817 | 8/1991 |
| JP | 1991-187215 | 8/1991 |
| JP | 03185817 | 8/1991 |
| JP | 03187215 | 8/1991 |
| JP | H3-185817 | 8/1991 |
| JP | H3-187215 | 8/1991 |
| JP | 1991-205830 | 9/1991 |
| JP | 1991-292741 | 12/1991 |
| JP | 03292741 | 12/1991 |
| JP | 1992-085818 | 3/1992 |
| JP | 1992-323834 | 11/1992 |
| JP | 04323834 | 11/1992 |
| JP | 1993-021378 | 1/1993 |
| JP | 05021378 | 1/1993 |
| JP | 1993-062911 | 3/1993 |
| JP | 05062911 | 3/1993 |
| JP | H5-62911 | 3/1993 |
| JP | 05-129202 | 5/1993 |
| JP | 1993-275335 | 10/1993 |
| JP | 1993-315269 | 11/1993 |
| JP | 05315269 | 11/1993 |
| JP | 1993-087171 | 12/1993 |
| JP | 06-021494 | 1/1994 |
| JP | 1994-013313 | 1/1994 |
| JP | 1994-112140 | 4/1994 |
| JP | 1994-204138 | 7/1994 |
| JP | 1994-302526 | 10/1994 |
| JP | 1994-310493 | 11/1994 |
| JP | 1994-338497 | 12/1994 |
| JP | 1995-006952 | 1/1995 |
| JP | H07-037823 | 2/1995 |
| JP | 1995-131007 | 5/1995 |
| JP | 1995-249618 | 9/1995 |
| JP | 07249618 | 9/1995 |
| JP | 08-045838 | 2/1996 |
| JP | 1996-078335 | 3/1996 |
| JP | 08-139032 | 5/1996 |
| JP | 1996-148427 | 6/1996 |
| JP | 1996-242006 | 9/1996 |
| JP | 08242006 | 9/1996 |
| JP | 08-279462 | 10/1996 |
| JP | 1996-298333 | 11/1996 |
| JP | 1996-306688 | 11/1996 |
| JP | 09-082651 | 3/1997 |
| JP | H09-153633 | 6/1997 |
| JP | 1997-191117 | 7/1997 |
| JP | 1997-260293 | 10/1997 |
| JP | 09260293 | 10/1997 |
| JP | 10-055971 | 2/1998 |
| JP | 1998-041321 | 2/1998 |
| JP | 10-223913 | 8/1998 |
| JP | 1998-203895 | 8/1998 |
| JP | 1998-308503 | 11/1998 |
| JP | 1998-321860 | 12/1998 |
| JP | 1999-087341 | 3/1999 |
| JP | 1999-238809 | 8/1999 |
| JP | 1999-256328 | 9/1999 |
| JP | 1999-317530 | 11/1999 |
| JP | 1999-326958 | 11/1999 |
| JP | 11317530 | 11/1999 |
| JP | 2000-68519 | 3/2000 |
| JP | 2000-077658 | 3/2000 |
| JP | 2000-232219 | 8/2000 |
| JP | 2000-299470 | 10/2000 |
| JP | 2000-323420 | 11/2000 |
| JP | 2000-340512 | 12/2000 |
| JP | 2000-340684 | 12/2000 |
| JP | 2001-007301 | 1/2001 |
| JP | 2001-015736 | 1/2001 |
| KR | 05-275679 | 10/1993 |
| KR | 1994-4441 | 5/1994 |
| KR | 1999-81566 | 11/1996 |
| KR | 1998-081556 | 11/1998 |
| KR | 1998-81556 | 11/1998 |
| KR | 1999-29923 | 4/1999 |
| KR | 10-0209852 | 7/1999 |
| KR | 1999-78392 | 10/1999 |
| KR | 2001-4563 | 1/2001 |
| KR | 1999-29923 | 2/2001 |
| KR | 2001-4563 | 9/2002 |
| WO | WO 99/35311 | 7/1999 |
| WO | WO 00/03061 | 1/2000 |
| WO | WO 00/03425 | 1/2000 |
| WO | WO 00/13227 | 3/2000 |
| WO | WO 02/064853 | 8/2002 |
| WO | WO 02/065508 | 8/2002 |
| WO | WO 02/065516 | 8/2002 |
| WO | WO 02/065517 | 8/2002 |
| WO | WO 02/065525 | 8/2002 |
| WO | WO 02/080244 | 10/2002 |

OTHER PUBLICATIONS

Olivares, J. et al.; "Solid-phase crystallization of amorphous SiGe films deposited by LPCVD on SiO2 and glass," Thin Solid Films 337 (1999) pp. 51-54.

Todd, Michael A. et al., "Deposition of Si 1-x Ge x Films for Gate Electrode Applications Using a Novel Approach," ICS13, The SiGe Conference; Santa Fe, NM, Mar. 2003.

Bensahel et al., "Industrial single wafer processing of in-situ doped polycrsyalline Si and Si1-xGex," *Solid State Technology*, Mar. 1998, pp. S5-S10.

Wolf, S. and Tauber, R., "Silicon Processing for the VLSI Era," vol. 1, Lattice Press, Sunset Beach, CA, p. 176 (2000).
Wong, "Beyond the Conventional Transistor," *IBM J. Res. & Dev.*, vol. 46, No. 2/3, Mar./May 2002.
Office Action in U.S. Appl. No. 10/074,534 mailed Mar. 28, 2003.
Final Office Action in U.S. Appl. No. 10/074,534 mailed Jul. 8, 2003.
Office Action in U.S. Appl. No. 10/074,534 mailed Mar. 25, 2004.
Office Action in U.S. Appl. No. 10/074,534 mailed Oct. 4, 2004.
Office Action in U.S. Appl. No. 11/124,340 mailed Jun. 28, 2006.
Office Action in U.S. Appl. No. 11/343,244 mailed Aug. 5, 2008.
Office Action in U.S. Appl. No. 11/343,244 mailed Nov. 26, 2008.
Office Action in U.S. Appl. No. 11/626,730 mailed Feb. 6, 2008.
Final Office Action in U.S. Appl. No. 11/626,730 mailed Sep. 5, 2008.
Korean Non Final Rejection Office Action 10-2008-7027835 mailed Feb. 13, 2009.
European Office Action for application 02757761.8-1528 dated Feb. 26, 2009.
Korean Office Action for application 2003-7010623 dated Aug. 17, 2009.
Japanese Office Action dated Jun. 15, 2010 in Japanese Patent Application No. 2002-578556 with English translation.
Japanese Office Action dated Feb. 4, 2009 in Application No. 2002-565349.
Japanese Office Action dated Nov. 9, 2010 in corresponding Application No. 2007-328687.
EPO Office Action for App. 02 757 761.8-1528 mailed Feb. 27, 2009.
Japan Office Action for 2004-529111 mailed Jul. 29, 2009.
Ikoma et al., "Growth of Si/3C-SiC/Si(100) heterostructures by pulsed supersonic free jets," Applied Physics Letters, vol. 75, No. 25, pp. 3977-3979, Dec. 1999.

* cited by examiner

Preferred Ge concentration profile for epitaxial Si-Ge layer in base layer of a heterojunction bipolar transistor Film Composition and Deposition Rate as a Function of Germane Flow Rate Using Silane at 600°C Film Composition and Deposition Rate as a Function of Germane Flow Rate Using Silane at 625°C Film Composition and Deposition Rate as a Function of Germane Flow Rate Using Silane at 650°C Film Composition and Deposition Rate as a Function of Germane Flow Rate Using Silane at 700°C Film Composition and Deposition Rate as a Function of Germane Flow Rate Using Trisilane at 600°C ($H_2$ Flow Rate = 20 slm)

Film Composition and Deposition Rate as a Function of Germane Flow Rate Using Trisilane at 600°C ($H_2$ Flow Rate = 30 slm)

SEM Photomicrograph of Si-Ge Film Deposited Using Silane and Germane

SEM Photomicrograph of Si-Ge Film Deposited Using Silane and Germane

SEM Photomicrograph of Si-Ge Film Deposited Using Trisilane and Germane

SEM Photomicrograph of Si-Ge Film Deposited Using Trisilane and Germane

ARRHENIUS PLOT FOR SILANE, DISILANE AND TRISILANE

PROCESS FOR DEPOSITION OF SEMICONDUCTOR FILMS

RELATED APPLICATION INFORMATION

This application is a divisional of U.S. patent application Ser. No. 11/124,340, filed on May 6, 2005 now U.S. Pat. No. 7,186,582 which is a continuation of U.S. patent application Ser. No. 10/074,534, filed on Feb. 11, 2002 (now U.S. Pat. No. 6,958,253), which claims priority to: U.S. Provisional Application No. 60/268,337, filed Feb. 12, 2001; U.S. Provisional Application No. 60/279,256, filed Mar. 27, 2001; U.S. Provisional Application No. 60/311,609, filed Aug. 9, 2001; U.S. Provisional Application No. 60/323,649, filed Sep. 19, 2001; U.S. Provisional Application No. 60/332,696, filed Nov. 13, 2001; U.S. Provisional Application No. 60/333,724, filed Nov. 28, 2001; and U.S. Provisional Application No. 60/340,454, filed Dec. 7, 2001; all of which are hereby incorporated by reference in their entireties.

This application is related to and incorporates by reference in their entireties, co-owned and U.S. patent application Ser. Nos.: 10/074,563 (now U.S. Pat. No. 6,821,825); 10/074,149 (now U.S. Pat. No. 6,716,751); 10/074,722 (now U.S. Pat. No. 7,026,219); 10/074,633 (now U.S. Pat. No. 6,900,115); and 10/074,564 (now U.S. Pat. No. 6,962,859).

BACKGROUND OF THE INVENTION

1. Field of the Invention

This invention relates generally to depositing semiconductor films, such as those containing Si, Ge and/or carbon for integrated circuit fabrication. More particularly, the invention relates to making these materials with greater control of thickness and composition in chemical vapor deposition systems.

2. Description of the Related Art

As the dimensions of microelectronic devices become smaller, the importance of the physical and chemical properties of the materials used in their manufacture becomes more important. This is particularly true for those advanced materials that can be integrated into existing generations of devices using already-proven manufacturing tools. For example, it is desirable to incorporate epitaxial $Si_{1-x}Ge_x$ and $Si_{1-x-y}Ge_xC_y$ alloys into Bipolar and BiCMOS device manufacturing processes to improve device efficiency and reliability. These advanced alloy materials have utility, for example, as base layers in heterojunction bipolar transistors (HBT), resistors in BiCMOS devices and as gate electrodes in CMOS, NMOS, and DMOS devices and various other integrated electronic devices.

Conventional processes for the deposition of single crystal, amorphous and/or polycrystalline silicon, silicon germanium (SiGe) and silicon germanium carbon (SiGeC) alloys are typically performed using batch thermal processes (either low pressure (LP) or ultra-high vacuum (UHV) conditions) or single wafer processes. Single wafer processes are becoming increasingly significant, but a number of problems remain. For instance, within-wafer and wafer-to-wafer uniformity, deposition rates, and process repeatability remain a concern with conventional single wafer processes, particularly for in situ doped semiconductor films. As wafers continue to increase in size (currently 300 mm wafers are being integrated into fabrication processes), maintaining uniformity is becoming more challenging still.

Japanese Patent Application Disclosure Number S60-43485 discloses the use of trisilane to make amorphous thin films at 300° C., apparently for photovoltaic applications. Japanese Patent Application Disclosure Number H5-62911 discloses the use of trisilane and germane to make epitaxial thin films at 500° C. or less. Japanese Patent Application Disclosure Number H3-91239, H3-185817, H3-187215 and H02-155225 each disclose the use of disilane, some also mentioning trisilane.

The art has generally focused on the use of disilane and trisilane for producing amorphous, hydrogenated silicon at relatively low deposition temperatures, particularly for photovoltaic cells. However, there remains a need for a process for depositing semiconductor materials such as doped silicon, low-H content amorphous silicon and SiGe onto surfaces, preferably at high deposition rates without sacrificing good uniformity.

SUMMARY OF THE INVENTION

The inventors have discovered better ways of making Si-containing and Ge-containing films. Methods are taught for using chemical precursors such as higher-order silanes and/or higher-order germanes in CVD processes to provide improved deposition of Si-containing films, particularly silicon, SiGe or SiGeC alloy thin films useful in the semiconductor industry. These chemical precursors have reduced thermal stability relative to silane, germane and conventional carbon-source molecules.

In one aspect of this invention, methods are taught for making non-single crystalline SiGe-containing films by using a deposition gas containing a higher-order silane and a germanium precursor. In a preferred embodiment, the higher order silane is trisilane and the germanium precursor is germane.

In another aspect of this invention, methods are taught for making graded SiGe-containing films by thermal CVD by using a deposition gas containing amounts of trisilane and a germanium precursor that are varied during the deposition. In a preferred embodiment, the amount of trisilane in the deposition gas is effective to incorporate germanium into the graded Si—Ge film in an amount that is a substantially linear function of the amount of germanium precursor.

These and other embodiments are described in greater detail below.

BRIEF DESCRIPTION OF THE DRAWINGS

These and other aspects of the invention will be readily apparent from the following description and from the appended drawings, which are meant to illustrate and not to limit the invention, and wherein.

DETAILED DESCRIPTION OF THE PREFERRED EMBODIMENTS

Figure 1:
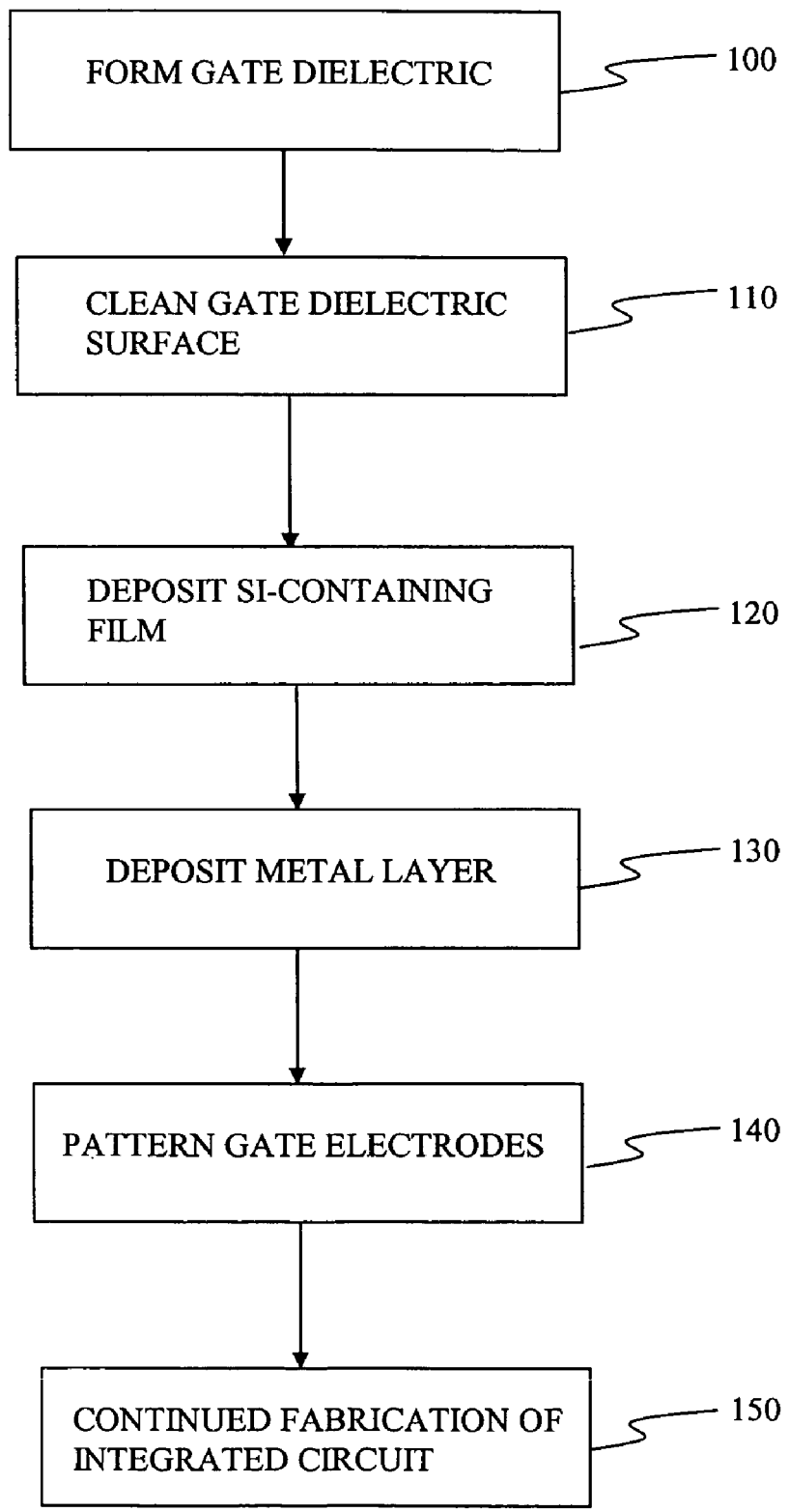
FIG. 1 is a flow chart generally illustrating the process of forming a gate stack in accordance with a preferred embodiment.

Dynamic temperature variations, due to limitations in heating and temperature control systems, play a significant role in the non-uniformity of film deposition on substrate surfaces by CVD. It is generally desirable for the deposited film to be as uniform as possible in both thickness and elemental composition, but existing processes tend to produce films that are non-uniform to varying degrees. Such non-uniformities often result from temperature variations across the surface of the substrate because under typical CVD process conditions the surface temperature of the substrate influences the deposition rate and the composition of the resulting film. Imperfect control over other process parameters, including gas flow rates and total pressure, are also believed to contribute to non-uniformities in film physical properties.

Uniformity is often sought by empirically tuning the deposition conditions e.g., gas flow rate, rotation speed of substrate, power distribution to heating elements, etc., to achieve an overall uniform thickness for the desired film. This is done by first depositing a large number of films on different substrates, each under a different pre-selected set of deposition conditions. The thickness variations within each film are then measured and the results analyzed to identify conditions that would eliminate the thickness variations. The inventor has realized, however, that such empirical tuning does not necessarily achieve uniform temperature distributions throughout the process; rather, conventionally tuning effectively time-averages the thickness variations produced by the temperature variations for a specific reaction temperature 'set-point'.

Accordingly, this empirical approach does not necessarily produce uniform temperatures across the substrate throughout the deposition process. This, in turn, raises the issue of compositional variation because compositional homogeneity (or at least control) is desired in three dimensions, both across the film surface and through the film thickness. This is because many films contain dopants and the level of these dopants influences the electronic properties of the film. Non-uniform temperatures can result in non-uniform incorporation of dopants into the film. Similarly, other non-uniformities in composition can result.

The preferred embodiments provide processes for solving this problem, each of which may be used individually or, preferably, together. One process involves the use of chemical precursors that allow for film deposition to be conducted substantially within a mass transport limited growth regime, relative to conventional precursors at the same temperature. For a given chemical precursor, the mass transport limited regime is a temperature range in which film deposition rates are independent of temperature. Deposition rates that are substantially within this temperature range are relatively unaffected by small temperature variations across the surface of the substrate, so long as those variations result in temperatures that remain at or near the mass transport limited regime. This allows for the production of films that are much more uniform, e.g., exhibit higher compositional uniformity and/or thickness uniformity, than films deposited at the same temperature using conventional chemical precursors. This is because conventional precursors require much higher temperatures in order for deposition to be in the mass transport limited regime.

Figure 16:
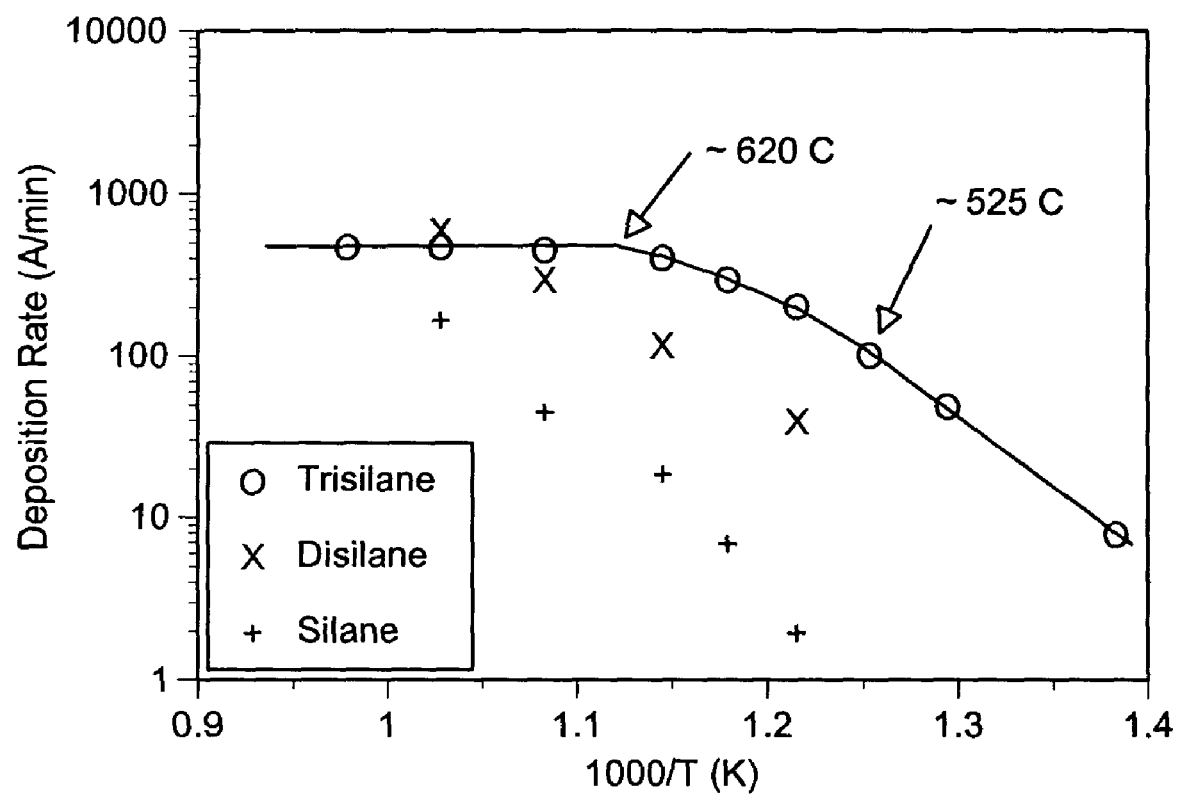
FIG. 16 shows an Arrhenius plot obtained under the conditions described below for silane, disilane and trisilane.

As will be appreciated by the skilled artisan, the temperature range for the mass transport limited regime can be determined for a given precursor and set of reaction conditions, and illustrated in an Arrhenius plot. For the chemical precursor trisilane, the transition point from temperature-dependent deposition rates to temperature-independent deposition rates is much lower than the transition point for silane or disilane, as illustrated in the Arrhenius plot shown in FIG. 16. The lower region of the plot up to the transition has a significant upward linear slope, indicating that silicon deposition by flowing trisilane within this temperature range is a strong function of temperature and therefore not within the mass transport limited regime. For example, FIG. 16 shows that silicon deposition using trisilane is not mass transport limited (i.e., is within the kinetic regime) at temperatures less than about 525° C., under the conditions used (25 sccm flow rate, 40 Torr pressure). In contrast, the region of the plot above the transition point is substantially flat, indicating that deposition using trisilane within this temperature range is independent of temperature and therefore within the mass transport limited regime. For example, FIG. 16 shows that trisilane deposition is clearly mass transport limited at temperatures of about 620° C. or greater. It will be understood that the transition occurs over a range of temperatures in which the declining slope of the Arrhenius plot indicates that the deposition of trisilane within this temperature range is substantially independent of temperature, near the mass transport limited regime. For example, FIG. 16 shows that trisilane deposition is substantially mass transport limited at temperatures of about 525° C. or greater. It will be understood that the transition point may increase somewhat at higher flow rates, and decrease somewhat at lower flow rates. For example, it has been determined experimentally that the transition point from temperature-dependent deposition to substantially mass transport limited deposition shifts to higher temperatures when the trisilane flow rate is increased. Accordingly, the use of trisilane enables substantially mass transport limited deposition at temperatures that are desirable for other reasons in contemporary fabrication (e.g., conservation of thermal budgets for maintaining crystal properties, controlling dopant profiles, etc.).

A variety of silicon- and germanium-containing chemical precursors can be suitably used in the film deposition processes disclosed herein to provide Si-containing films, Ge-containing films and alloy films that contain both Si and Ge, e.g., silicon germanium (SiGe, without implying stoichiometry) films. These chemical precursors may also be used in conjunction with carbon sources to provide alloy films, e.g., SiC and SiGeC (without implying stoichiometry) alloy thin films. Preferred Si-containing chemical precursors suitable for use in the instant invention include higher-order, non-halogenated hydrides of silicon, particularly silanes of the formula $Si_nH_{2n+2}$ where n=2-6. Particular examples include disilane ($H_3SiSiH_3$), trisilane ($H_3SiSiH_2SiH_3$), and tetrasilane ($H_3SiSiH_2SiH_2SiH_3$). Trisilane (also represented by $Si_3H_8$) is most preferred for achieving a balance of volatility and reactivity. Substantially or nearly mass transport limited deposition, at relatively low temperatures, is preferred (but not necessary) for SiGe deposition. Preferred Ge-containing chemical precursors suitable for use in the instant invention include higher-order germanes of the formula $Ge_nH_{2n+2}$ where n=2-3. In other arrangements, the germanium source can comprise $(H_3Ge)(GeH_2)_x(GeH_3)$, where x=0-2. Particular examples include digermane ($H_3GeGeH_3$), trigermane ($H_3GeGeH_2GeH_3$) and tetragermane ($H_3GeGeH_2GeH_2GeH_3$).

In a preferred embodiment, the chemical precursors are used in conjunction with a source of carbon. Preferred carbon sources include silylmethanes $[(H_3Si)_{4-x}CR_x]$ where x=0-3 and R=H and/or D. The preferred silylmethanes are disilylmethane, trisilylmethane and tetrasilylmethane (x=0-2), with tetrasilylmethane being most preferred. Additional preferred carbon sources include hydrocarbons such as methane, ethane, propane, butanes, etc.; carbon monoxide, carbon dioxide and HCN. These chemical precursors and carbon sources may be purchased from commercial sources or synthesized by methods known to those skilled in the art. Si-containing films such as SiC, SiNC and SiOC (none of which short forms imply particular stoichiometries) have a variety of uses in the semiconductor manufacturing industry, e.g., as etch stop layers, hard masks, and passivation layers.

The films are preferably deposited at a temperature that is substantially within the mass transport limited regime for the particular chemical precursor that is used. For any particular chemical precursor and set of reaction conditions, the mass transport limited regime can be determined from an Arrhenius plot empirically-derived from deposition data at various temperatures. The Arrhenius plot for the most preferred silicon precursor, trisilane, for a particular set of conditions is appended as FIG. 16, discussed above.

In addition to employing preferred chemical precursors (particularly trisilane) as described herein and selecting a deposition temperature within or near the mass transport limited regime for that precursor, deposition in accordance with the preferred processes preferably involves proper selection of other deposition parameters, particularly gas flow rate. Proper selection of gas flow rate, in combination with deposition substantially within the mass transport limited regime, has been found to yield films at much higher deposition rates compared to silane, while maintaining a high degree of uniformity. For depositions using silane at temperatures in the kinetic regime, film uniformity depends primarily on the temperature controller set points and, to a much lesser extent, the gas flow rate controller set points. In contrast, for depositions involving higher-order silanes at temperatures substantially within the mass transport limited regime, it has been found that the sensitivity to temperature controller set points and gas flow controller set points is reversed. For example, for depositions using trisilane at temperatures substantially within the mass transport limited regime, fine tuning the temperature controller set points has much less effect on film uniformity than tuning the gas flow rate controller set points.

When deposition is conducted as described herein, the resulting film is preferably more uniform than a comparable film. As used herein, a "comparable" film is made in a manner that is substantially identical in all meaningful aspects to the inventive film in question, except that silane is used in place of a higher-order silane and/or germane is used in place of a higher-order germane, and the deposition process for each film is individually tuned to take into account the aforementioned differences in sensitivity to temperature and gas flow controller set points. More particularly, when comparing the results of different layers, thickness uniformity is to be measured by the following standard: a randomly selected diameter across a wafer is employed and 49 points along that diameter are measured for deposited layer thickness. No measurements are taken within a 3 mm exclusion zone at the wafer periphery. The range in thickness measurements (e.g., ±6 Å) over those 49 points is then divided by the sum of the maximum thickness measurement plus the minimum thickness measurement from among the 49 points. This non-uniformity is expressed as a percentage herein. When measuring thickness uniformity of a film having a surface that is not accessible to such a measurement, e.g., a film onto which one or more additional layers have been applied, or a film contained within an integrated circuit, the film is cross sectioned and examined by electron microscopy. The film thickness is measured at the thinnest part of the cross sectioned film and at the thickest part, and the range in thickness measurements (e.g., ±6 Å) between these two points is then divided by the sum of the two measurements. This non-uniformity is expressed as a percentage herein. Advantageously, the methods employing the precursors described herein have been found to result in extraordinarily high deposition rates and yet, surprisingly, obtain exceptionally high uniformity and smoothness.

For example, a preferred SiGe film is made using trisilane and digermane, and has greater uniformity at greater deposition rates than a comparable film made from a process separately optimized using silane in place of the trisilane at the same temperature. Likewise, a preferred SiGe film is made using a higher order germane and has greater uniformity than a comparable film made using germane in place of the higher-order germane. Furthermore, higher deposition rates at a lower reaction temperature are also attainable using the silicon and germanium sources disclosed.

The preferred temperature range tends to depend on the particular chemical precursor, with lower temperatures being more appropriate as the thermal stability decreases. For higher-order silanes and higher order germanes, lower temperatures are preferred as chain-length increases. Thus, the preferred temperature range for disilane deposition tends to be higher than for trisilane, which in turn tends to be higher than for tetrasilane, etc. A similar trend holds for the germane series. A preferred temperature for depositing trisilane is higher than about 350° C., preferably higher than about 450° C. in order to minimize hydrogen content in the resulting film. More preferably, in order to attain deposition near or within the mass transport limited regime, temperatures are maintained higher than about 525° C., even more preferably higher than about 550° C., most preferably higher than about 600° C. The process may be carried out at a temperature above 700° C., but a temperature of about 700° C. or less is preferred. Preferred temperatures are thus in the range of 450° C. to about 700° C., more preferably in the range from about 525° C. to about 650° C. For any particular chemical precursor or mixture thereof, the most preferred temperature range may be found through routine experimentation, following the guidelines provided herein. It will be understood that the listed temperatures are preferred for thermal CVD. Lower temperatures will be appropriate for plasma assisted deposition processes, depending upon the level of hydrogen incorporation that is acceptable for the application.

Selection of the deposition temperature can also depend partly upon the desired crystallinity in the layer being deposited. For example, predominantly crystalline silicon can be deposited in the range of about 620° C. to 800° C., which is clearly within the mass transport limited regime, as discussed above. More preferably, polycrystalline layer deposition is conducted between 650° C. and 750° C. Lower temperatures can be used for amorphous layer deposition, but preferably temperatures are selected to remain at least substantially mass transport limited (i.e., preferably at higher than 525° C. for the preferred conditions). Epitaxial deposition is largely dependent upon the purity of the surface upon which deposition is to take place. Namely, as will be recognized by the skilled artisan, an extremely clean single-crystal surface, such as the upper surface of a previously-deposited epitaxial layer or the upper surface of a single crystal wafer, enables epitaxial deposition at a large range of temperatures, depending upon flow rates, pressure, etc. Typically, epitaxial deposition upon a suitable surface can take place between 500° C. and 1160° C. It is preferred to employ the lower temperature ranges, such as from about 500° C. to about 750° C., for reasons of consideration of thermal budgets.

Preferably, deposition is carried out using a chemical precursor e.g., higher-order silane and/or higher-order germane, at a temperature that is effective to achieve higher deposition rates and/or more uniform films, as compared to comparable films made using silane and/or germane.

Deposition using these chemical precursors may be suitably conducted according to the various vapor deposition methods known to those skilled in the art, but the greatest benefits are obtained when deposition is conducted according to the improved chemical vapor deposition (CVD) process techniques taught herein. The disclosed processes may be suitably practiced by employing CVD, including plasma-enhanced chemical vapor deposition (PECVD) or thermal CVD, utilizing a feed gas comprised of a Si- and/or Ge-containing chemical precursor to deposit a Si- and/or Ge-containing film onto a substrate contained within the CVD chamber. In a preferred embodiment, the gas comprises trisilane and a Si-containing film is deposited. In another preferred embodiment, the gas comprises a higher-order silane and a higher-order germane, and a SiGe film is deposited.

A suitable manifold may be used to supply feed gas(es) to the CVD chamber. Experimental results described herein were conducted in a CVD chamber with horizontal gas flow, and preferably the chamber is a single-wafer, horizontal gas flow reactor, preferably radiantly heated. Suitable reactors of this type are commercially available, and preferred models include the Epsilon™ series of single wafer epitaxial reactors commercially available from ASM America, Inc. of Phoenix, Ariz. While the processes described herein can also be employed in alternative reactors, such as a showerhead arrangement, benefits in increased uniformity and deposition rates have been found particularly effective in the horizontal, single-pass, laminar gas flow arrangement of the Epsilon™ chambers.

The chemical precursors are preferably supplied to the CVD chamber in the form of a feed gas or as components of a feed gas, at the temperatures and pressures used for deposition. The total pressure in the CVD chamber is preferably in the range of about 0.001 Torr to about atmospheric pressures, more preferably in the range of about 0.1 Torr to about 200 Torr, most preferably in the range of about 1 Torr to about 80 Torr. Surprisingly, the processes described herein obtain extremely high uniformity despite being conducted well above conventional low pressure CVD (LPCVD) pressure ranges (typically in the milliTorr range). The partial pressure of each Si- and/or Ge-containing chemical precursor is preferably in the range of about $1 \times 10^{-6}$% to about 100% of the total pressure, more preferably about $1 \times 10^{-4}$% to about 100%, same basis. The partial pressure of each carbon source, if any, is preferably in the range from 0% to about 1% of the total pressure, more preferably about $1 \times 10^{-6}$% to about 0.1%, same basis. If used, the partial pressure of the carbon source is preferably effective to provide the resulting Si-containing and/or Ge-containing film with a carbon content of about 20% or less (10% or less for single crystal materials), even more preferably about 10% or less (5% or less for single crystal materials), where the percentages are by weight based on total film weight.

At temperatures in or near the mass transport limited regime, it has been found that the deposition efficiency of trisilane is advantageously high. In some cases, e.g., as demonstrated in working Examples 1-4 below, the efficiency is so high that non-uniform films (thicker at the edge than in the middle) may result when deposition is conducted at relatively low feed gas flow rates, e.g., feed gas rates typical for silane deposition. This invention is not limited by any theory of operation, but it is believed that, when deposition efficiency is high and the feed gas contacts one part of the substrate before another, at low flow rates the feed gas can become relatively depleted in trisilane as it traverses the substrate. As a result, greater amounts of film are deposited on the first-contacted portion of the substrate, where the local concentration of trisilane is relatively higher, than on the later-contacted portion of the substrate, where the local concentration of trisilane is relatively low. This effect is not typically observed when the feed gas is silane because silane deposition efficiency is relatively low as compared to trisilane.

It has been found that this problem may be addressed by adjusting the amount of trisilane supplied to the substrate surface, e.g., by increasing the flow rate of the feed gas, so that the rate at which trisilane is supplied to the surface is equal to or greater than the rate at which the trisilane is consumed by the deposition process. In practice, the flow rate of the feed gas is preferably selected in conjunction with the deposition temperature to provide the film with a greater degree of uniformity than a comparable film made using silane in place of trisilane, as illustrated in working Examples 16-19 below. Increasing the flow rate of trisilane is also advantageous because it allows for higher deposition rates. However, even when the trisilane flow rate is less than silane, all other conditions being equal, the deposition rate can be higher because of the greater deposition efficiency of trisilane, as illustrated in working Examples 5-15 below. Preferred flow rates thus may be adjusted to provide the desired degree of uniformity and the desired deposition rate, taking into account the deposition temperature and the partial pressure of trisilane in the feed gas, as well as practical considerations such as reactor size and configuration.

The feed gas can also include gases other than chemical precursor(s) and carbon sources, such as inert carrier gases. Exemplary carrier gases include helium, argon, krypton and neon. Hydrogen is most preferred as a carrier gas for the processes described herein, particularly for epitaxial deposition. Nitrogen can also be employed for polycrystalline and amorphous film deposition. Other compounds can be present in the feed gas as desired. Preferably the gas is further comprised of one or more compounds selected from the group consisting of silane, disilane, tetrasilane, germane, digermane, trigermane, $NF_3$, monosilylmethane, disilylmethane, trisilylmethane, tetrasilylmethane, and a dopant precursor.

Dopant precursors include diborane, deuterated diborane, phosphine, and arsine. Silylphosphines [$(H_3Si)_{3-x}PR_x$] and silylarsines [$(H_3Si)_{3-x}AsR_x$] where x=0-2 and $R_x$=H and/or D are preferred dopant sources of phosphorous and arsenic. $SbH_3$ and trimethylindium are preferred sources of antimony and indium, respectively. Such dopants and dopant sources are useful for the preparation of preferred films such as boron-, phosphorous-, antimony-, indium-, and arsenic-doped silicon, SiGe and SiGeC films, by the methods described herein. The dopant concentration in these materials, when doped, is preferably in the range of from about $1\times10^{14}$ to about $1\times10^{22}$ atoms/cm$^3$. Dopants can be incorporated using very low concentrations of the dopant sources, e.g., as mixtures in hydrogen with concentration ranging from about 1 ppm to about 1%, by weight based on total. These diluted mixtures can then be delivered to the reactor via a mass flow controller with set points ranging from 10 to 200 standard cubic centimeters per minute (sccm), depending on desired dopant concentration and dopant gas concentration. The dopant source is also preferably further diluted in the carrier gas delivered to the reactor with the silicon/germanium/carbon sources. Since flow rates often range from about 20 standard liters per minute (slm) to about 180 slm, the concentration of the dopant used in a typical process is usually very small.

The relative partial pressures of the chemical precursors (and carbon source, if any) can be held relatively constant over the course of depositing the Si-containing and/or Ge-containing film, or can be varied to produce a graded film that has differing amounts of Si and/or Ge as a function of depth within the thickness of the film. Preferably, the film has a thickness in the range of about 10 Å to about 5,000 Å. The elemental composition of the film may vary in a stepwise and/or continuous fashion. Film thickness may be varied as suitable for the intended application, by varying the deposition time and/or gas flow. As discussed below, the use of mixtures containing germanium precursor(s) and higher order silane(s) allows for the deposition of higher quality, better controlled graded films. Whether constant or graded, compound and doped films deposited by the methods described herein have relatively constant composition across a plane at any particular given depth. The "plane" in this sense may undulate if the film is deposited over a patterned substrate.

Figure 4:
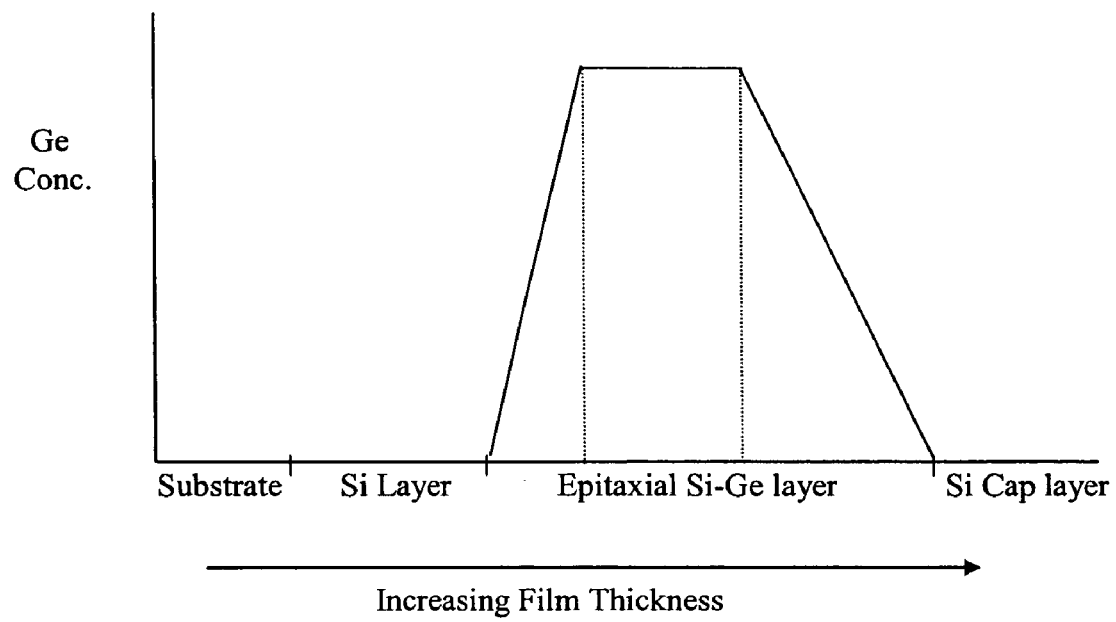
FIG. 4 schematically illustrates a preferred Ge concentration profile in an epitaxial Si—Ge layer for the base layer of a heterojunction bipolar transistor.

Graded films having improved properties may be prepared using preferred chemical precursors (particularly trisilane). For example, FIG. 4 illustrates a preferred Ge concentration profile for an epitaxial SiGe film, in the context of the base layer in a heterojunction bipolar transistor ("HBT"). In the illustrated embodiment, the Si—Ge film layer includes a central portion have a substantially constant Ge concentration that is sandwiched between graded portions in which the Ge concentration varies as a function of film thickness.

Preferably, the Ge concentration in the graded layer varies linearly as a function of film thickness, as shown in FIG. 4. However, it has been found that the fabrication of such graded layers is often difficult to achieve, particularly by thermal CVD using silane. Although it would appear that a linear Ge gradation could be achieved by making a corresponding linear change in the relative amount of Ge precursor in the silane-containing CVD deposition gas, in practice it has been found that such deposition is greatly complicated by non-linear deposition behavior.

Figure 5:
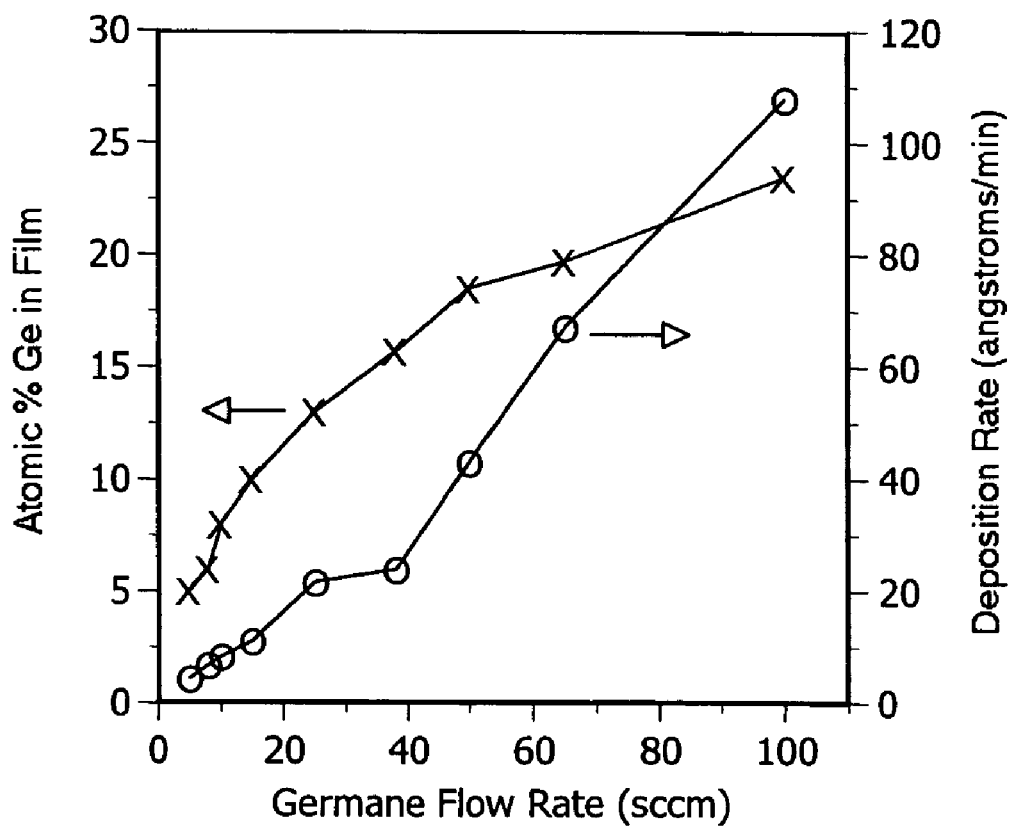
FIG. 5 is a plot of film composition and deposition rate as a function of germane flow rate using silane at 600° C.

For example, the effect of changing the amount of Ge precursor during CVD deposition using a silane-containing deposition gas is shown in FIGS. 5-8. During the illustrated depositions, the amount of Ge precursor (germane) in the deposition gas was varied by changing the germane flow rate. The effect of changing the germane flow rate on the amount of Ge incorporated into the film and on the deposition rate of the film was measured as described in the Examples below. At a deposition temperature of 600° C., FIG. 5 shows that the amount of germanium incorporated into the resulting film (left-hand axis) is not a linear function of the amount of germane in the deposition gas. Thus, a linear ramp-up or ramp-down in germane flow during deposition does not produce a Si—Ge film in which the Ge concentration has a correspondingly linear profile under these deposition conditions.

Deposition is further complicated by the non-linear effect of changing Ge precursor flow on deposition rate. FIG. 5 also shows that the deposition rate of the Si—Ge film (right-hand axis) increases non-linearly as a function of increasing germane flow, with a degree of non-linearity that is significantly different from the degree of non-linearity in Ge incorporation shown on the left-hand axis. This greatly complicates the task of depositing a smoothly graded Si—Ge film having a specified thickness and a specified Ge content because of the additional difficulties associated with simultaneously compensating for the observed non-linearities in both Ge concentration and film deposition rate.

Figure 6:
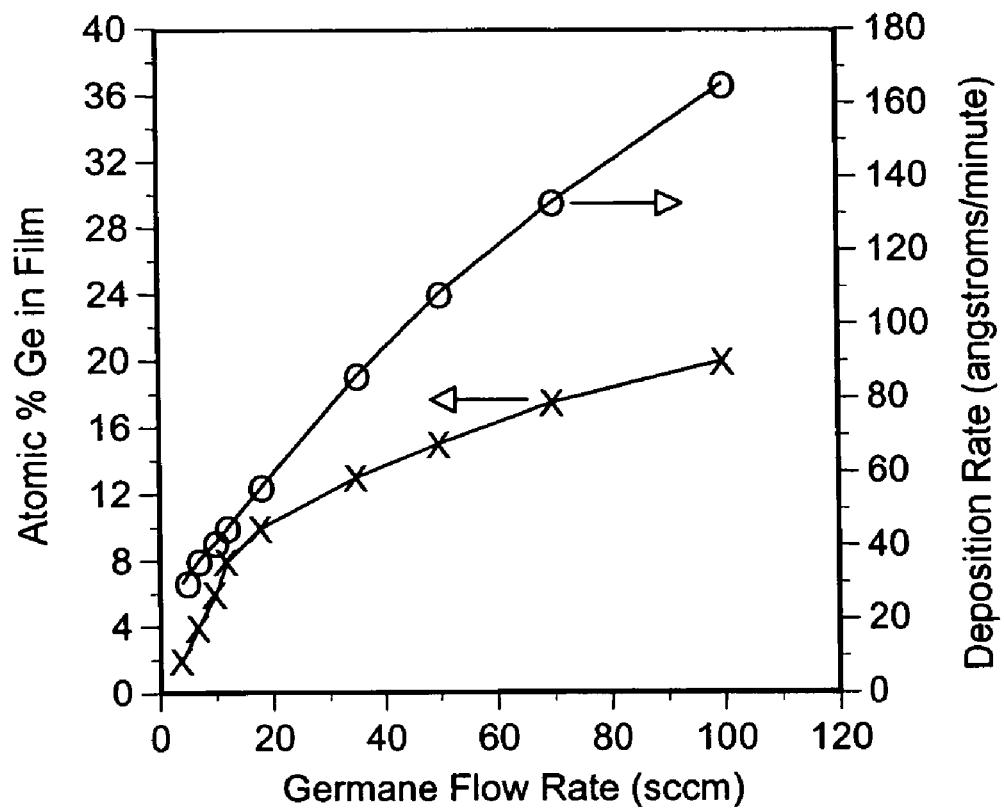
FIG. 6 is a plot of film composition and deposition rate as a function of germane flow rate using silane at 625° C.
Figure 7:
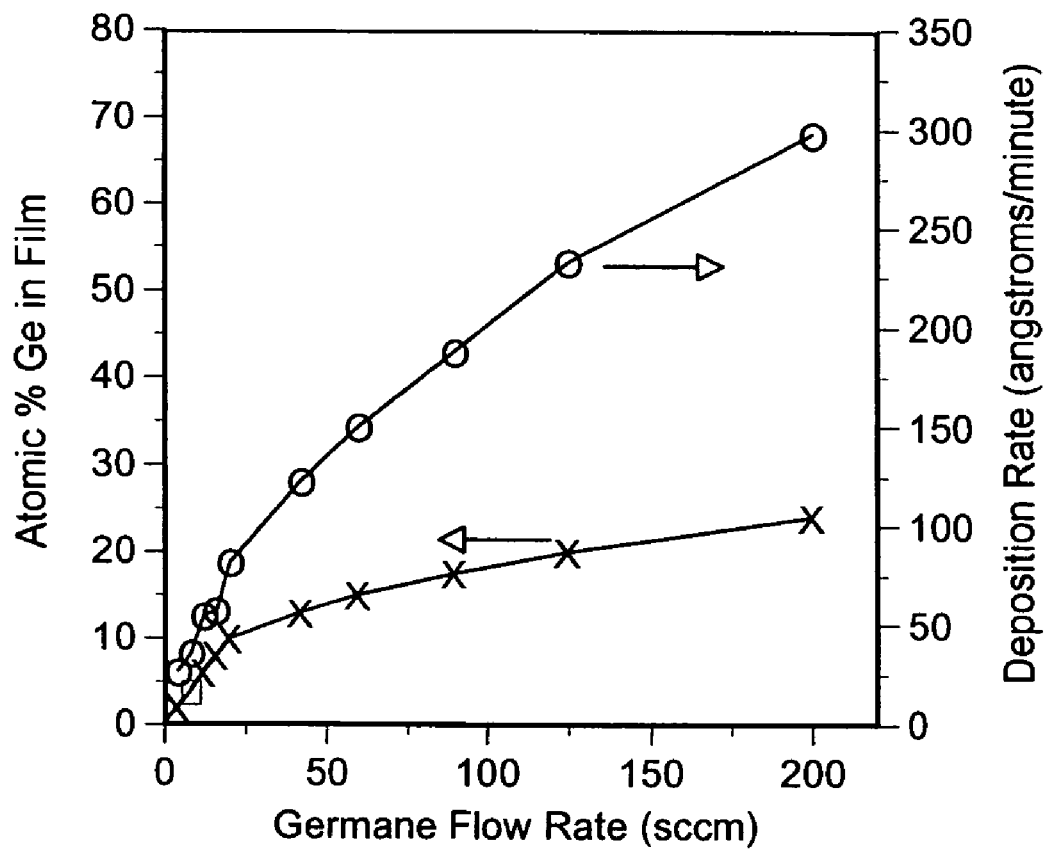
FIG. 7 is a plot of film composition and deposition rate as a function of germane flow rate using silane at 650° C.
Figure 8:
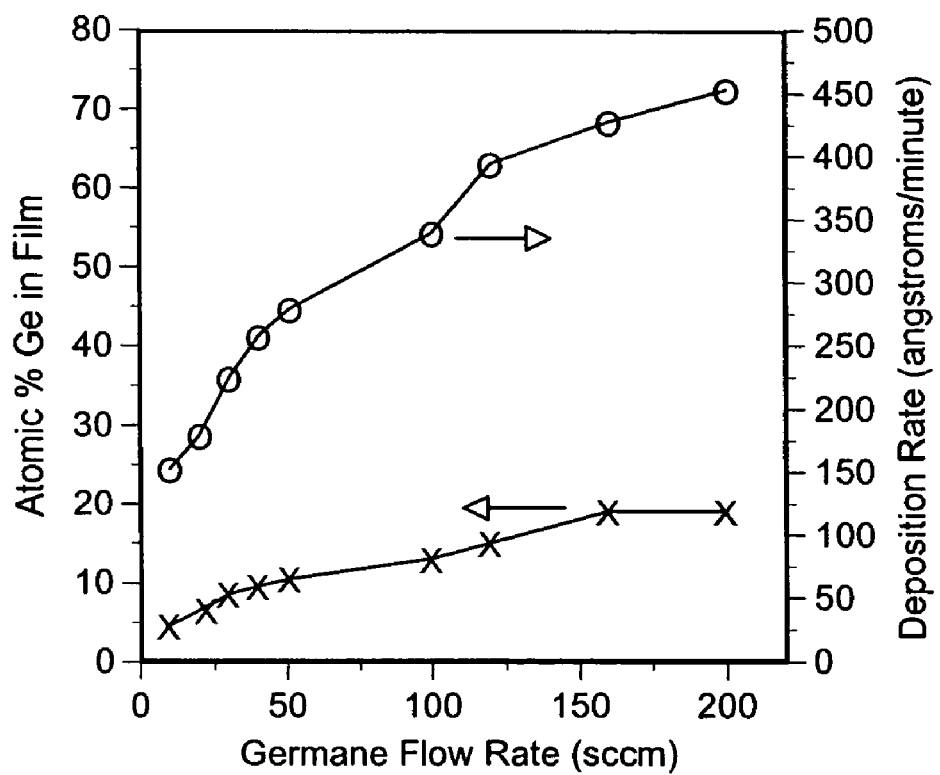
FIG. 8 is a plot of film composition and deposition rate as a function of germane flow rate using silane at 700° C.

FIGS. 6-8 show that concentration and deposition rate non-linearities for thermal CVD using silane/germane are similarly observed at higher deposition temperatures. This means that the deposition problems encountered at 600° C. are not eliminated by increasing the deposition temperatures to 625° C. (FIG. 6), 650° C. (FIG. 7), or even 700° C. (FIG. 8). In fact, since the shapes of the plots are different at each temperature, these plots indicate that relatively small temperature variations across the surface of a substrate are likely to further complicate deposition using silane/germane.

Figure 9:
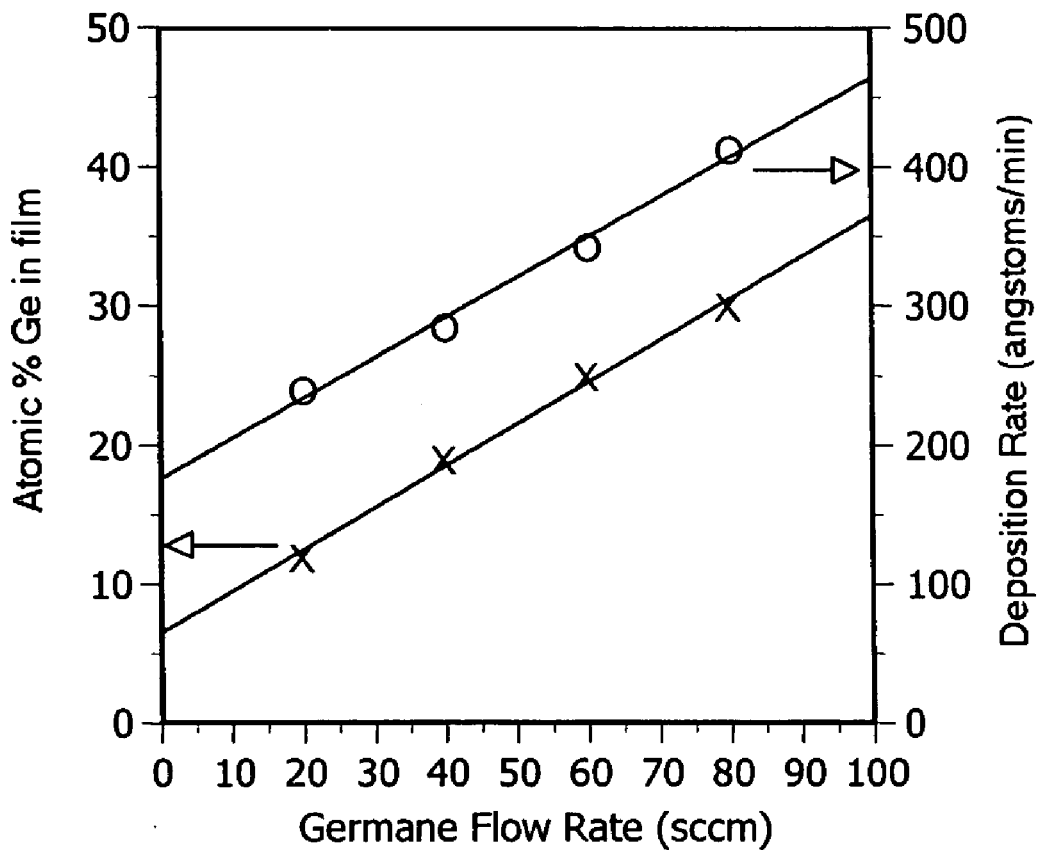
FIG. 9 is a plot of film composition and deposition rate as a function of germane flow rate using trisilane at 600° C. at a $H_2$ flow rate of 20 slm.
Figure 10:
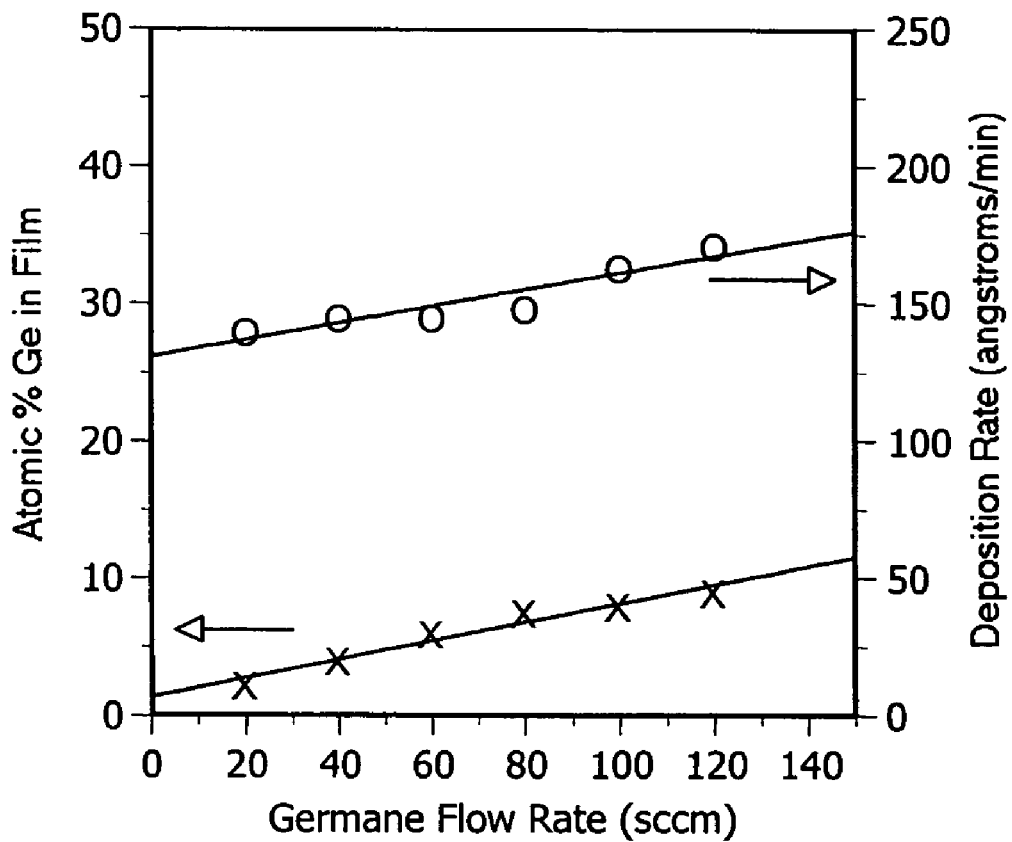
FIG. 10 is a plot of film composition and deposition rate as a function of germane flow rate using trisilane at 600° C. at a $H_2$ flow rate of 30 slm.

The use of a deposition gas that contains trisilane greatly simplifies the task of depositing a graded Si-containing film using thermal CVD. For example, the effect of changing the amount of Ge precursor during CVD deposition using a trisilane-containing deposition gas is shown in FIGS. 9-10. The data shown in FIGS. 9-10 were obtained under the conditions described in the Examples below. In contrast to the non-linearities apparent in FIGS. 5-8, FIG. 9 shows that the Ge incorporation into the film is a substantially linear function of the germane flow rate. FIG. 9 also illustrates preferred linearity in the deposition rate as a function of the germane flow rate. The data is taken over a large range of Ge concentrations and Ge deposition rates of interest in IC fabrication contexts. It is preferred that both Ge incorporation and deposition rate be substantially linear functions of flow rate in order to facilitate the process of depositing graded Si—Ge films. Those skilled in the art will appreciate that data such as that shown in FIGS. 9 and 10 can be used to determine preferred conditions for the deposition of graded films, preferably graded Si—Ge films. FIG. 10 also illustrates preferred linearity of Ge incorporation and deposition rate for trisilane/germane under higher $H_2$ flow rate conditions and a different germane concentration than illustrated in FIG. 9, demonstrating that the advantages of using trisilane are not limited to the specific conditions used to obtain the data in FIG. 9.

It will be apparent to those skilled in the art that the use of a deposition gas that comprises a higher-order silane (particularly trisilane) and a germanium precursor provides additional significant advantages for the deposition of Si—Ge films. For example, the use of such higher-order silanes allows for higher deposition rates and greater control over film thickness and composition, preferably resulting in higher device quality and improved manufacturing yield and throughput. It will also be apparent that the deposition gas may optionally further comprise silane, higher-order silane(s), and germanium precursor(s), along with dopant precursor(s), carbon source(s) and carrier gases. Preferably, the ratio of higher-order silane to silane in any such mixture is about 1:1 or greater, more preferably about 4:1 or greater, most preferably about 9:1 or greater, by weight based on total amount of silane and higher-order silane. Preferably, the higher-order silane is trisilane, and most preferably the mixture is substantially free of silane. Preferably, the Si—Ge layer is doped with boron, arsenic, phosphorous or antimony. The ability to deposit high quality doped Si—Ge layers at relatively low temperatures enables strained heteroepitaxial Si—Ge films containing higher amounts of Ge to be made, a significant advantage for the production of HBTs.

The use of a deposition gas that contains a higher-order silane, particularly trisilane, also allows for the deposition of SiGe films having a degree of uniformity that is greater than a comparable film prepared using silane instead of the higher-order silane. In a preferred embodiment, non-single crystalline SiGe is deposited using a deposition gas that comprises a higher-order silane and a germanium source, more preferably a higher order silane selected from the group consisting of disilane, trisilane, and tetrasilane, along with a germanium precursor selected from the group consisting of germane, digermane, trigermane, and tetragermane. Most preferably, the higher silane is trisilane, and the germanium precursor is germane or digermane. Mixtures of various silanes and germanium precursors may be used. The deposition gas may further comprise other compounds (particularly carbon sources) as described herein for the purpose of making doped SiGe and alloys containing Si and Ge, such as one or more compounds selected from the group consisting of monosilylmethane, disilylmethane, trisilylmethane, tetrasilylmethane, and a dopant precursor.

The amount of germanium precursor and/or the flow rate during deposition can affect the crystallinity of the resulting SiGe-containing film. Under a given set of deposition conditions, films having lower degrees of crystallinity are generally produced as deposition temperatures are lowered. In a preferred embodiment, deposition temperatures are selected so that the resulting SiGe-containing film (including carbon-doped SiGe) is amorphous. Preferred deposition temperatures are about 600° C. or lower, more preferably about 550° C. or lower. Since higher deposition rates are usually preferred, deposition is preferably conducted at a temperature of about 450° C. or higher, more preferably about 525° C. or higher, although lower temperatures may occasionally be suitable. Deposition of amorphous films is preferably conducted at a temperature in the range of about 450° C. to about 600° C., more preferably about 475° C. to about 575° C., most preferably about 525° C. to about 575° C.

In another preferred embodiment, deposition temperatures are selected so that the resulting SiGe-containing film (including carbon-doped SiGe) is at least partially crystalline. Greater crystallinity is favored at higher deposition temperatures, for a given set of deposition conditions. Preferred deposition temperatures are about 575° C. or higher, more preferably about 600° C. or higher. Since preservation of thermal budget is usually important, deposition temperatures are preferably about 800° C. or below, more preferably about 700° C. or below, although higher temperatures can be used if needed. Deposition is preferably conducted at a temperature in the range of about 575° C. to about 750° C., more preferably about 600° C. to about 700° C.

Preferably, polycrystalline SiGe-containing films, obtained by depositing over non-single crystal materials such as gate dielectric materials, have a surface roughness of about 10% or less, more preferably about 5% or less, based on the mean thickness of the film, as measured by atomic force microscopy on a 10 micron×10 micron scan area. When deposition is conducted as described herein, polycrystalline SiGe films can be obtained that have surface roughness values that are much less than comparable SiGe films deposited using silane in place of trisilane, as demonstrated in Examples 88-89 and FIGS. 12-15. Preferred amorphous SiGe-containing films are also very smooth, and preferably have a surface roughness of about 10% or less, more preferably about 5% or less, even more preferably about 2% or less, based on the mean thickness of the film, as measured by atomic force microscopy on a 10 micron×10 micron scan area.

Deposition of the silicon- and germanium-containing films described herein is preferably conducted at a rate of about 50 Å per minute or higher, more preferably about 75 Å per minute or higher, most preferably about 100 Å per minute or higher. Exemplary films include SiGe films and SiGeC films, which can be boron-doped, arsenic-doped or phosphorous-doped films. The Si-containing film can be amorphous, polycrystalline or epitaxial. Trisilane has been shown to be particularly advantageous for improving deposition rates and uniformity of epitaxial layers.

The preferred embodiments also provide another process for solving the uniformity problems discussed above, which problems are applicable to both graded and non-graded films. Examples of this process are given in FIG. 3 and Example 39, and the process is described more generally here. Through-thickness compositional non-uniformities in deposited films are believed to result from, inter alia, dynamic (as opposed to static) variations in substrate surface temperature. CVD chambers are generally equipped with a temperature controller that is configured to allow programming with a set of temperature control conditions that are kept constant throughout the deposition of a particular layer. This set point temperature is generally selected at the beginning of the process and maintained until the layer is completed. As discussed above, the thickness problem is typically approached by empirically tuning the deposition conditions e.g., gas flow rate, rotation speed of substrate, power distribution to heating elements, etc., to effectively time-average the thickness effects of the temperature variations.

It has been found that a temperature set point, or a set of reactor conditions affecting temperature control more generally, that results in a film that is relatively uniform in composition and thickness for the first 5 Å to 1,000 Å of film deposition can be found empirically, but the film then typically becomes less uniform as deposition continues. The reasons for this are not well understood, and this invention is not limited by theory, but emissivity and other properties of the substrate, and SiC-coated graphite reactor components, that change as a function of deposition time, can affect the temperature control system. This, in turn, can produce temperature variations that result in compositional and thickness variations.

Whatever the reason for the shift to less uniform deposition, it has now been found that a layer-by-layer approach can be used to produce films having greater uniformity. In accordance with this embodiment, a set of empirically-determined temperature set points $T_1$, $T_2$, $T_3$, etc. can be determined on a layer-by-layer basis. A single film, having a single function at a particular point in an integrated circuit, is broken down into several layers during the empirical determination and optimal set points are determined for each layer. Accordingly, temperature control variations caused by the growing thickness of the film can be compensated by use of separately optimized set points during the deposition process. Use of trisilane is particularly advantageous for this process, since each thin layer can be uniformly formed.

Such an empirical determination can be conducted by first depositing a first layer on each of a number of separate workpieces using various temperature set points, then measuring the thickness and compositional variation of the first layer on each workpiece to identify which set point resulted in the most uniform layer. The target thickness of the layer may vary as desired, e.g., from about 50 Å to about 1,000 Å, preferably about 100 Å to about 700 Å, depending on the level of uniformity required for the particular application.

A first-layer is then prepared on several more workpieces at the identified set point $T_1$ to serve as substrates for the empirical determination of the second set point $T_2$. As in the determination of $T_1$, a second layer is deposited onto the first film of each of these workpieces using various temperature set points, then the thickness and compositional variation of each layer is measured to identify which second set point resulted in the most uniform second layer. As above, the target thickness of the second layer may vary as desired, e.g., from about 50 Å to about 1,000 Å, preferably about 100 Å to about 700 Å, depending on the level of uniformity required for the particular application. The process can then be halted, if the optimized first and second layers form a multi-layer film having the desired thickness and degree of uniformity. If a thicker film is desired, the process can be continued by, e.g., preparing a batch of workpieces having two layers deposited at the first two identified set points $T_1$ and $T_2$, depositing a third layer onto the second layer of each workpiece using various temperature set points, measuring the thickness and compositional variation of each layer to identify which third set point $T_3$ resulted in the most uniform third layer, etc.

Temperature set point is used herein as an example of a temperature control variable that is normally kept constant during a deposition process, but that can be varied during deposition by the empirical process taught above. This empirical process can also be applied to other temperature control variables that are normally kept constant during a single film deposition process, such as temperature offsets for a PID controller or PID coefficient(s).

Process variables such as gas flow rate, gas flow distribution, partial pressure and gas composition are preferably varied in processes similar to that described above for identifying the temperature set point, or during the same experiments, in order to identify the desired deposition conditions for each layer. Preferably, experimental design methods are used to determine the effect of the various process variables and combinations thereof on uniformity and/or deposition rate. Experimental design methods per se are well-known, see e.g., Douglas C. Montgomery, "Design and Analysis of Experiments," $2^{nd}$ Ed., John Wiley and Sons, 1984. For a particular process, after the effect of the various process variables and combinations thereof on layer uniformity and/or deposition rate has been determined by these experimental design methods, the process is preferably automated by computer control to ensure batch-to-batch or wafer-to-wafer consistency. Most preferably, the process improvements result from in-situ, stepwise or dynamic adjustments to the process variables mentioned above. This empirical method of tuning process variables to individually improve the properties of the layers has been found to improve the properties of the overall single structural or functional film (comprising multiple layers from a process standpoint) regardless of any theory expressed herein. Therefore, the functioning of this embodiment does not depend on the correctness or incorrectness of any theory.

Having determined the desired set points $T_1$, $T_2$, $T_3$, $T_4$, etc., the preferred embodiment may be practiced using a CVD chamber that is equipped with a temperature controller configured to allow programming with multiple temperature set points for a single recipe. The process is preferably conducted by entering a temperature set point $T_1$ into a temperature controller and introducing a first gas comprised of $X_1\%$ of a first Si-containing chemical precursor to the CVD chamber. A first Si-containing layer is then deposited onto a substrate contained within the chamber. The process is preferably continued by entering a temperature set point $T_2$ into the temperature controller, introducing a second gas comprised of $X_2\%$ of a second Si-containing chemical precursor to the CVD chamber, and depositing a second Si-containing layer onto the first Si-containing layer, thereby forming a multi-layer Si-containing film. The second Si-containing chemical precursor may be chemically identical to the first Si-containing chemical precursor or may be different, as discussed below and illustrated by FIG. 3 and Example 39.

The process can be continued further by, e.g., entering a temperature set point $T_3$ into the temperature controller, introducing a third gas comprised of $X_3\%$ of a third Si-containing chemical precursor to the CVD chamber, and depositing a third Si-containing layer onto the second Si-containing layer, and so on, producing as many layers as desired.

Preferred Si-containing chemical precursors include higher order silanes as described elsewhere herein, as well as conventional chemical precursors such as silane. Preferably at least one of the first Si-containing chemical precursor and the second Si-containing chemical precursor is selected from the group consisting of silane, disilane and trisilane. At least one of the first gas, second gas and third gas includes an additional germanium and/or other dopant source, preferably a compound selected from the group consisting of germane, digermane, trigermane, $NF_3$, monosilylmethane, disilylmethane, trisilylmethane, tetrasilylmethane, and an electrical dopant precursor, as described elsewhere herein. Preferably, the amount of each Si-containing chemical precursor $X_n$, for $X_1\%, X_2\%, X_3\%, X_4\%$, etc., in the gas is independently in the range of about $1 \times 10^{-6}\%$ to about 100%, preferably about $1 \times 10^{-4}\%$ to about 100%, by volume based on total volume, at any particular stage of the deposition process.

The substrate preferably has a temperature of about 350° C. or higher, more preferably in the range of 450° C. to about 700° C. The CVD chamber is preferably a single-wafer, horizontal gas flow reactor. The resulting multiple layer Si-containing film is preferably selected from the group consisting of a microdot, a SiGe film, a SiGeC film, a SiN film, a silicon-oxygen film, a silicon-carbon-nitrogen film, and a silicon-oxygen-nitrogen film. Such films can be doped with, e.g., P, As or B.

Figure 3:
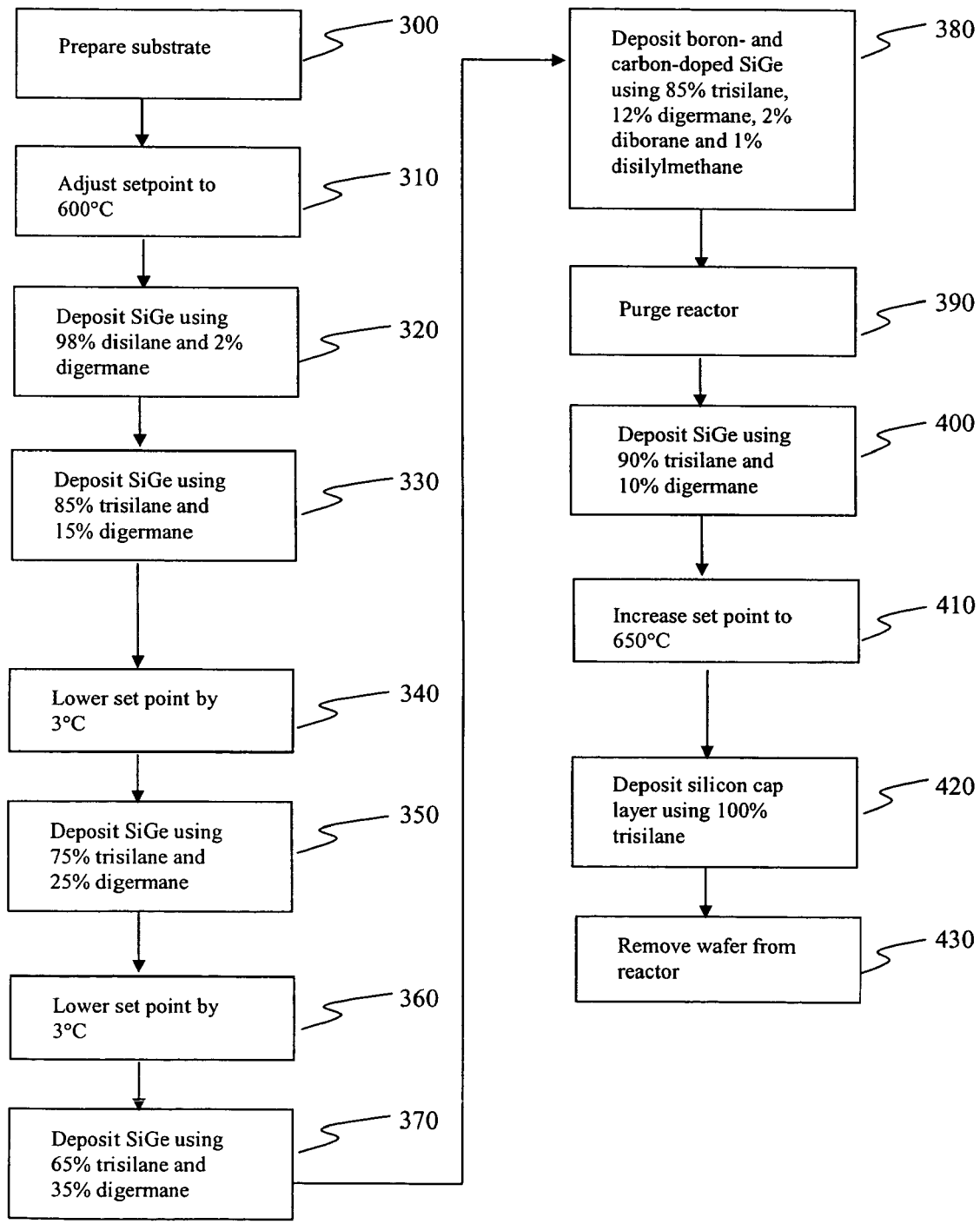
FIG. 3 is a flow chart generally illustrating the process of changing the temperature set point during the deposition process in accordance with a preferred embodiment.

The processes of the preferred embodiments may be practiced by depositing the multiple layers of the film in a stepwise or continuous fashion. Advantageously, when the deposition is paused to adjust the temperature set point, process variables such as flow rate, partial pressure and gas composition can also be adjusted as desired to produce films having varied compositions. For instance, the deposited film may have a homogenous or uniform composition as discussed above, or may vary in composition step-wise or continuously. The identity of the Si-containing chemical precursor can be altered during the pause, and/or the amount in the gas $X_1\%$, $X_2\%, X_3\%, X_4\%$, etc. can be varied. In a preferred embodiment, the process involves the growth of a graded germanium concentration layer by non-continuous or step-wise changes in germanium concentration, preferably achieved by preparing a superlattice with discontinuous periodicity by depositing layers of selected germanium concentration on top of each other. Example 39 below and FIG. 3 illustrate this embodiment.

It will be understood that the overall "film" of this embodiment constitutes a single structural film from the point of view of its function in an integrated circuit, and will typically have a similar composition throughout its thickness. Similar composition, for defining a single film formed by the stepwise deposition process described above, thus encompasses graded films wherein the same constituents have different concentrations at different points through the thickness of the film.

Methods of determining film uniformity and deposition rates are well-known. Deposition rates may be determined by measuring the average thickness of the film as a function of time and can be expressed in units of angstroms per minute (Å/min.). Preferred deposition rates are about 20 Å/min. or greater, more preferably about 50 Å/min. or greater, most preferably 100 Å/min. or greater. Suitable methods for measuring film thickness include multiple-point ellipsometric methods. Instruments for measuring film thickness are well known and commercially available and preferred instruments include the NanoSpec® series of instruments from Nanometrics, Inc., Sunnyvale, Calif.

The term "uniformity," as used herein to refer to the uniformity of deposited films, is used to refer to both thickness uniformity and compositional uniformity. Film thickness uniformity is preferably determined by making multiple-point thickness measurements, determining the mean thickness, and determining the average amount that the multiple measurements differ from the mean. To enable comparisons, the result can be expressed as percent non-uniformity. More particularly, when comparing the results of different layers, thickness uniformity is to be measured by the following standard: a randomly selected diameter across a wafer is employed and 49 points along that diameter are measured for deposited layer thickness. No measurements are taken within a 3 mm exclusion zone at the wafer periphery. The range in thickness measurements (e.g., ±6 Å) over those 49 points is then divided by the sum of the maximum thickness measurement plus the minimum thickness measurement from among the 49 points. When measuring thickness uniformity of a film having a surface that is not accessible to such a measurement, e.g., a film onto which one or more additional layers have been applied, or a film contained within an integrated circuit, the film is cross sectioned and examined by electron microscopy. The film thickness is measured at the thinnest part of the cross sectioned film and at the thickest part, and the range in thickness measurements (e.g., ±6 Å) between these two points is then divided by the sum of the two measurements. This non-uniformity is expressed as a percentage herein. Preferably, the percent non-uniformity is about 10% or less, more preferably about 5% or less, most preferably about 2% or less.

Compositional uniformity may be determined using electrical measurements (i.e. 4-point probe), SIMS (Secondary Ion Mass Spectrometry), RBS (Rutherford Backscattering Spectroscopy), Spectroscopic Ellipsometry and/or high resolution X-ray diffractometry (HR-XRD). When comparing one Si-containing film to another, or one deposition process to another, compositional uniformity is measured using SIMS across a circular wafer substrate onto which the Si-containing has been deposited. SIMS measurements are made at three locations: one at the center of the wafer, one at a point midway between the center and the edge ("r/2"), and one at a point 3 millimeters from the edge ("3 mm edge exclusion"). For each non-silicon element in question, the amount of that element at each location is then determined from the SIMS data, and the resulting value expressed in atomic % based on total. The three values are then averaged, and the standard deviation determined. For a given Si-containing film or deposition process, compositional non-uniformity is the standard deviation divided by the sum of the maximum and minimum measured values, and the result expressed as a percentage. For example, if all three values are the same, the compositional non-uniformity is 0%, because the standard deviation is zero; if the three values are 3 atomic %, 5 atomic %, and 10 atomic %, the compositional non-uniformity is 28% (3.6/13=28%) because the standard deviation is 3.6 and the sum of the maximum (10) and minimum (3) values in 13; etc.

Preferred values of compositional non-uniformity vary, depending on the amount of the element in the Si-containing film. If the amount of element is 1 atomic % or greater, the compositional non-uniformity for the Si-containing film is preferably about 22% or less, more preferably about 17% or less, even more preferably about 12% or less, and most preferably about 7% or less. Ge content in SiGe films, for example, will typically represent greater than about 1 atomic % of such films, such that the above preferences apply to SiGe films. If the amount of element is in the range of 0.001 atomic percent up to 1 atomic %, the compositional non-uniformity for the Si-containing film is preferably about 90% or less, more preferably about 65% or less, even more preferably about 40% or less, and most preferably about 22% or less. If the amount of element is below 0.001 atomic percent, the compositional non-uniformity for the Si-containing film is preferably about 375% or less, more preferably about 275% or less, even more preferably about 175% or less, and most preferably about 75% or less. Ge content in graded SiGe films, for example, may vary over a broad range, and thus more than one of the above ranges may apply depending on the profile.

A preferred embodiment provides films useful in the microelectronic industry for various applications. A preferred SiGe film has a thickness non-uniformity of less than about 10% and a compositional non-uniformity of less than about 10%. Films such as described herein are useful in various applications, e.g., as a transistor gate electrode. The layers described herein are particularly useful for forming critical device layers in integrated circuits, such as gate layers in integrated transistors. Other examples include semiconductor layers in heterojunction bipolar transistors (HBT's). Processes for making such integrated circuits from such films are known to those skilled in the art. These integrated circuits may be incorporated into computer systems by methods known to those skilled in the art and thus a further preferred embodiment provides a computer system comprised of one or more of such integrated circuits.

FIG. 1 is a flow diagram showing a preferred process flow in which deposition processes described herein can be employed. A gate dielectric is formed 100 over a semiconductor substrate. The gate dielectric is cleaned 110, if necessary, and a SiGe-containing layer is deposited 120, as described herein, preferably including flowing trisilane. An optional further metallic layer can also be deposited 130 over the SiGe-containing layer, if desired for improved lateral signal transmission. These multiple layers are then photolithographically patterned 140, and fabrication continues 150.

Figure 2:
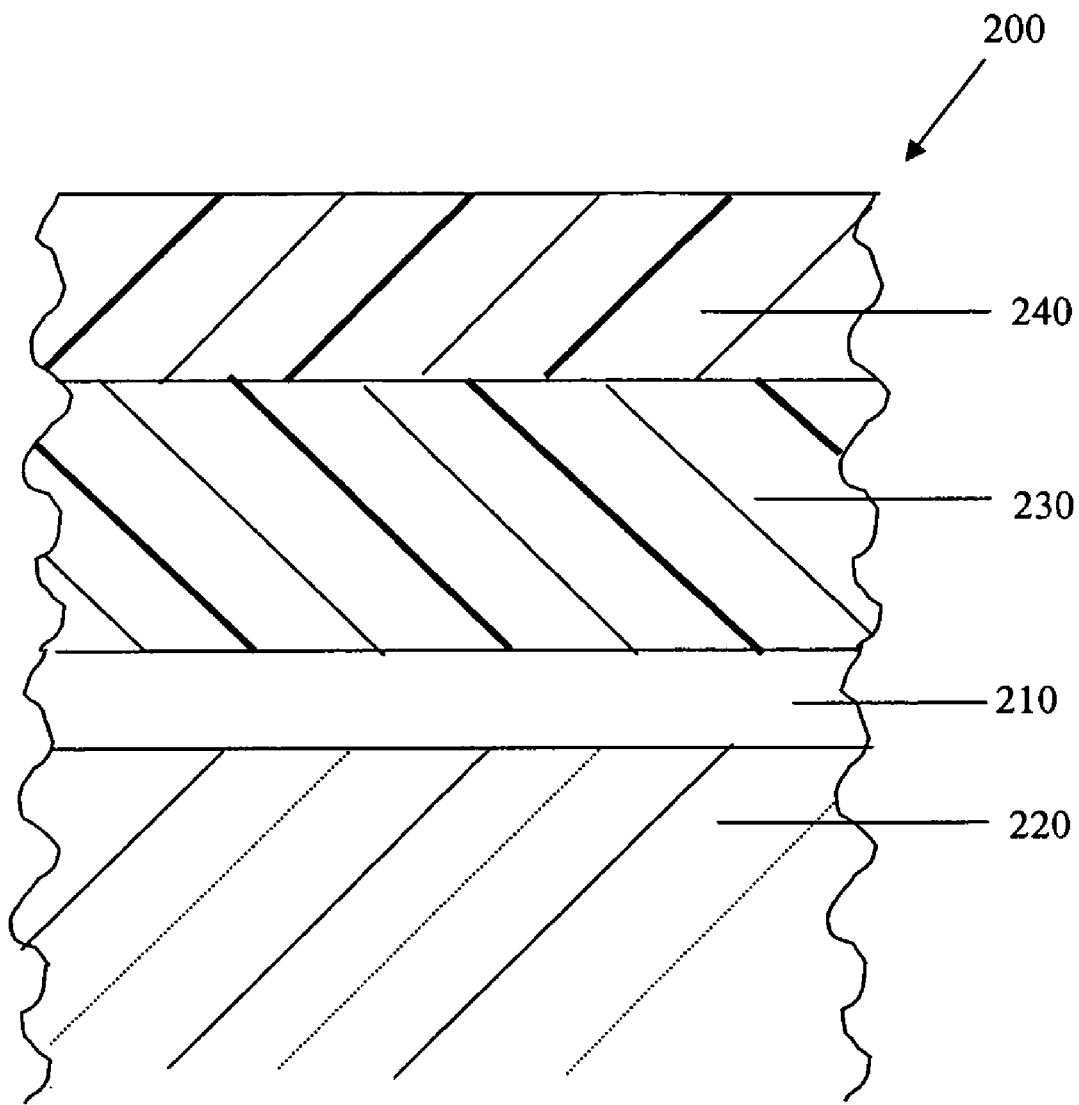
FIG. 2 illustrates a gate stack in accordance with a preferred embodiment.

FIG. 2 illustrates a gate stack 200 formed by the process of FIG. 1. A gate dielectric 210 is formed over a semiconductor substrate 220. After optionally cleaning the dielectric surface, an electrically doped SiGe film 230 is formed over the gate dielectric 210 and an optional metal layer 240 is positioned over the Si-containing film 230 to form the gate stack 200. Preferably, if the optional metal layer 240 is deposited over the SiGe film 230, a silicon layer (not shown) is first deposited onto the Si-containing film 230. The stack 200 is then patterned to form gate electrodes (not shown in FIG. 2) and the fabrication of the integrated circuit is continued.

Desirably, the gate dielectric 210 comprises at least one high k material, with a dielectric constant greater than 5 and more preferably greater than 10. Exemplary materials comprise aluminum oxide, hafnium oxide and zirconium oxide, preferably formed by atomic layer deposition (ALD) for high quality, pinhole free layers. Advantageously, the use of trisilane at or near the mass transport limited regime, particularly in conjunction with a higher-order germane, avoids problems of slow nucleation times experienced by traditional silicon deposition over such high k materials.

In another example, epitaxial Si-containing layers are deposited, flowing trisilane, over single-crystal substrates. Silicon layers and heteroepitaxial SiGe, SiC and SiGeC layers can be deposited by processes described herein.

Another preferred embodiment provides an apparatus for depositing a Si-containing material on a surface. This apparatus comprises a CVD chamber, a vessel containing trisilane, a feed line operatively connecting the vessel to the CVD chamber to allow passage of the trisilane from the vessel to the CVD chamber, and a temperature controller operatively disposed about said vessel and maintained at a temperature in the range of about 10° C. to about 70° C., preferably about 15° C. to about 52° C., to thereby control the vaporization rate of the trisilane. Examples of suitable temperature controllers include thermoelectric controllers and/or liquid-filled jackets. Preferably, the CVD chamber is a single-wafer, horizontal gas flow reactor. Preferably, the apparatus is also comprised of a manifold operatively connected to the feed line to control the passage of the trisilane from the vessel to the chemical vapor deposition chamber. Preferably, a heat source is operatively disposed about the feed line and the gas lines are heated to about 35° C. to about 70° C., more preferably between about 40° C. and about 52° C., to prevent condensation at high gas flow rates. Preferably, trisilane is introduced by way of a bubbler used with a carrier gas to entrain trisilane vapor, more preferably a temperature-controlled bubbler, most preferably a temperature-controlled bubbler in combination with heated gas lines to deliver trisilane.

EXAMPLES

The following examples were conducted using an ASM Epsilon 2000™ horizontal flow epitaxial reactor system, configured with a Bernoulli wand wafer transfer system, purge-only load locks, a non-slide concave susceptor, a 'square' pre-heat ring, adjustable spot lamps and independently tunable gas inlet injectors. The Si-containing and Ge-containing precursors were supplied to the chamber in a feed gas that also contained hydrogen and a diborane dopant. About 120 sccm of 1% $B_2H_6$ in $H_2$ was diluted in 2 slm $H_2$ and 120 sccm of this mixture was introduced into the reactor, mixed with 20 slm $H_2$ and the precursor, and deposited onto a rotating substrate under the flow rate conditions as shown in the examples. Deposition rates were estimated from oxygen and boron depth profiles using SIMS measurements and optical ellipsometer measurements (Nanometrics).

Examples 1-4

Si-containing films were deposited using trisilane as a chemical precursor according to the parameters shown in Table 1. The deposition temperature was 700° C., well within the mass transport limited regime for trisilane. However, the resulting films were not uniform and instead had a concave deposition profile (thin in middle and thicker at edges) because the trisilane flow rate was inadequate (under these particular deposition conditions that were tuned for silane-based deposition) to provide a uniform film.

TABLE 1

| No. | Temp. (° C.) | Pressure (Torr) | Flow Rate Set Point (sccm) | Precursor | Substrate | Deposition Profile |
|---|---|---|---|---|---|---|
| 1 | 700 | 40 | 50 | $Si_3H_8$ | $SiO_2$ | Concave |
| 2 | 700 | 40 | 45 | $Si_3H_8$ | $SiO_2$ | Concave |
| 3 | 700 | 40 | 15 | $Si_3H_8$ | $SiO_2$ | Concave |
| 4 | 700 | 40 | 25 | $Si_3H_8$ | $SiO_2$ | Concave |

Examples 5-15

Si-containing amorphous films were deposited using trisilane and silane as chemical precursors and diborane as a dopant precursor according to the parameters shown in Table 1. About 120 sccm of 1% $B_2H_6$ in $H_2$ was diluted in 2 slm $H_2$ and 120 sccm of this mixture was introduced into the reactor where it was mixed with 20 slm $H_2$ and trisilane or silane at the flow rate shown in Table 2. These results show that much higher deposition rates were generally obtained at a given temperature using trisilane, as compared to silane, even when the flow rate for trisilane was lower than that for silane.

TABLE 2

| No. | Temp. (° C.) | Pressure (Torr) | Flow Set Point (sccm) | Precursor | Substrate | Deposition Rate (Å/min.) |
|---|---|---|---|---|---|---|
| 5C | 650 | 40 | 50 | $SiH_4$ | $SiO_2$ | 46 |
| 6C | 650 | 40 | 50 | $SiH_4$ | Si<100> | 68 |
| 7 | 650 | 40 | 50 | $Si_3H_8$ | Si<100> | 462 |
| 8C | 600 | 40 | 50 | $SiH_4$ | $SiO_2$ | 19 |
| 9C | 600 | 40 | 50 | $SiH_4$ | Si<100> | 9 |
| 10 | 600 | 40 | 20 | $Si_3H_8$ | $SiO_2$ | 359 |
| 11 | 600 | 40 | 15 | $Si_3H_8$ | Si<100> | 181 |
| 12C | 550 | 760 | 25 | $SiH_4$ | $SiO_2$ | <1 |
| 13C | 550 | 40 | 50 | $SiH_4$ | $SiO_2$ | 7 |
| 14 | 550 | 40 | 30 | $Si_3H_8$ | $SiO_2$ | 287 |
| 15C | 550 | 40 | 50 | $SiH_4$ | $SiO_2$ | 2 |

C: Comparative

Examples 16-19

Si-containing films were deposited using trisilane and silane as chemical precursors, according to the parameters shown in Table 3. Deposition times were adjusted so that the films each had an average thickness of about 500 Å. Deposition rates were determined by measuring average film thickness using a Nanometrics ellipsometer and then dividing this number by the deposition time. Film thickness non-uniformity was determined from a 49-point thickness map of the film thickness. The results show that a much more uniform film was obtained at a much higher deposition rate by using trisilane at the indicated temperature in place of silane. This is true at 550° C., but dramatically more so at 600° C.

TABLE 3

| No. | Precursor | Temp. (° C.) | % Non-Uniformity | Deposition Rate (Å/min.) |
|---|---|---|---|---|
| 16C | $SiH_4$ | 600 | 5.93 | 18.6 |
| 17 | $Si_3H_8$ | 600 | 0.83 | 372 |
| 18C | $SiH_4$ | 550 | 8.5 | 7.4 |
| 19 | $Si_3H_8$ | 550 | 7.31 | 287 |

Examples 20-38

Examples 1-19 are repeated except that SiGe films are obtained by using a mixture of 80% trisilane and 20% digermane in place of trisilane alone, and by using a mixture of 80% silane and 20% germane in place of silane. Higher deposition rates were observed than with the use of trisilane or silane alone.

Example 39

A SiGe film is prepared by superlattice growth with discontinuous periodicity as follows, with reference to the flow chart shown in FIG. 3. A Si <100> substrate is prepared 300 by performing an ex-situ hydrogen-fluoride (HF) last clean to remove the native oxide layer, followed by introducing the substrate into a reactor chamber under a high flow of ultra-pure hydrogen gas. The wafer is rotated at 60 rpm while the wafer is heated to about 900° C. under a high flow of hydrogen gas (to remove any contaminants from the substrate surface). The wafer is cooled and allowed to stabilize at 700° C. and an arsenic-doped silicon buffer layer about 300 Å thick is grown using trisilane and trisilylarsine under mass transport limited conditions.

The wafer temperature is adjusted 310 by cooling under hydrogen flow to 600° C. The first period of SiGe superlattice is grown 320 using 98% disilane and 2% digermane. A second period of SiGe superlattice is grown 330 using 85% trisilane and 15% digermane.

Under a flow of hydrogen, the set point temperature is lowered 340 by 3° C. and the wafer is allowed to stabilize for 30 seconds. A third period of SiGe superlattice is grown 350 using 75% trisilane and 25% digermane.

Under a flow of hydrogen, the set point temperature is lowered 350 by 3° C. and the wafer is allowed to stabilize for 30 seconds. A fourth period of SiGe superlattice is grown 370 using 65% trisilane and 35% digermane. A fifth period of SiGe superlattice doped with carbon and boron is grown 380 using 85% trisilane, 12% digermane, 2% diborane and 1% disilylmethane. Under a flow of hydrogen, the reactor is purged 390 for 30 seconds. A sixth period of SiGe superlattice is grown 400 using 90% trisilane and 10% digermane.

Under a flow of hydrogen, the temperature set point is increased 410 to 650° C. and the relative powers of the lamp banks are adjusted slightly to maximize the within-wafer uniformity of the silicon cap layer to be grown 420. The wafer is allowed to stabilize for 30 seconds. The silicon cap layer is grown using 100% trisilane. The wafer is removed 430 from the reactor and next wafer is processed.

Examples 40-48 (Comparative)

A series of films was deposited using the ASM Epsilon 2000™ horizontal flow epitaxial reactor system described above. Silane (20 sccm) and germane (1.5% in $H_2$) were introduced into the reactor, mixed with 20 slm $H_2$, and used to deposit a film onto a rotating substrate at a pressure of 80 torr and a temperature of 600° C., under the germane flow rate conditions shown in Table 4 below. The Ge concentrations in the resulting films were determined by Rutherford Backscattering Spectroscopy (RBS). Deposition rates were determined by measuring average film thickness using a Nanometrics ellipsometer and then dividing this number by the deposition time. The Ge concentration and deposition rate data are shown in Table 4 below and plotted in FIG. 5.

TABLE 4

| No. | $GeH_4$ Flow Rate (slm) | Atomic % Ge in Film | Deposition Rate (Å/minute) |
|---|---|---|---|
| 40 | 5 | 5 | 4.4 |
| 41 | 8 | 6 | 6.8 |
| 42 | 10 | 8 | 8.2 |
| 43 | 15 | 10 | 11 |
| 44 | 25 | 13 | 21.6 |
| 45 | 38 | 15.7 | 23.8 |
| 46 | 50 | 18.5 | 43 |
| 47 | 65 | 19.7 | 67 |
| 48 | 100 | 23.5 | 108 |

Examples 49-57 (Comparative)

A series of films was deposited under the conditions described above for Examples 40-48 under the flow rate conditions shown in Table 5 below, except that the deposition temperature was 625° C. The Ge concentrations in the resulting films and the deposition rates were determined as described above for Examples 40-48. The Ge concentration and deposition rate data are shown in Table 5 below and plotted in FIG. 6.

TABLE 5

| No. | $GeH_4$ Flow Rate (slm) | Atomic % Ge in Film | Deposition Rate (Å/minute) |
|---|---|---|---|
| 49 | 4 | 2 | 30 |
| 50 | 7 | 4 | 36 |
| 51 | 10 | 6 | 41 |
| 52 | 12 | 8 | 45 |
| 53 | 18 | 10 | 56 |
| 54 | 35 | 13 | 86 |
| 55 | 50 | 15 | 108 |
| 56 | 70 | 17.5 | 133 |
| 57 | 100 | 20 | 165 |

Examples 58-67 (Comparative)

A series of films was deposited under the conditions described above for Examples 40-48 under the flow rate conditions shown in Table 6 below, except that the deposition temperature was 650° C. The Ge concentrations in the resulting films and the deposition rates were determined as described above for Examples 40-48. The Ge concentration and deposition rate data are shown in Table 6 below and plotted in FIG. 7.

TABLE 6

| No. | $GeH_4$ Flow Rate (slm) | Atomic % Ge in Film | Deposition Rate (Å/minute) |
|---|---|---|---|
| 58 | 4 | 2 | 27 |
| 59 | 8 | 4 | 36 |
| 60 | 12 | 6 | 55 |
| 61 | 16 | 8 | 58 |

TABLE 6-continued

| No. | GeH₄ Flow Rate (slm) | Atomic % Ge in Film | Deposition Rate (Å/minute) |
|---|---|---|---|
| 62 | 20 | 10 | 82 |
| 63 | 42 | 13 | 123 |
| 64 | 60 | 15 | 150 |
| 65 | 90 | 17.5 | 188 |
| 66 | 125 | 20 | 233 |
| 67 | 200 | 24 | 298 |

Examples 68-76 (Comparative)

A series of films was deposited under the conditions described above for Examples 40-48 under the flow rate conditions shown in Table 7 below, except that the deposition temperature was 700° C. The Ge concentrations in the resulting films and the deposition rates were determined as described above for Examples 40-48. The Ge concentration and deposition rate data are shown in Table 7 below and plotted in FIG. 8.

TABLE 7

| No. | GeH₄ Flow Rate (slm) | Atomic % Ge in Film | Deposition Rate (Å/minute) |
|---|---|---|---|
| 68 | 10 | 4.5 | 152 |
| 69 | 20 | 6.5 | 179 |
| 70 | 30 | 8.5 | 224 |
| 71 | 40 | 9.5 | 257 |
| 72 | 51 | 10.5 | 279 |
| 73 | 100 | 13 | 339 |
| 74 | 120 | 15 | 394 |
| 75 | 160 | 17 | 427 |
| 76 | 200 | 19 | 453 |

Examples 77-80

A series of films was deposited under the conditions described above for Examples 40-48 under the flow rate conditions shown in Table 8 below, except that trisilane was used in place of silane, the pressure was 40 torr, and the germane concentration in the H₂ was 10%. Trisilane was supplied to the reactor via a H₂ bubbler at a flow rate set point of 25 sccm. The Ge concentrations in the resulting films and the deposition rates were determined as described above for Examples 40-48. The Ge concentration and deposition rate data are shown in Table 8 below and plotted in FIG. 9.

In contrast to the non-linearities apparent in FIGS. 5-8, FIG. 9 shows that the amount of Ge incorporated into the film is a substantially linear function of the germane flow rate. FIG. 9 also shows that the deposition rate is a substantially linear function of the germane flow rate.

TABLE 8

| No. | GeH₄ Flow Rate (slm) | Atomic % Ge in Film | Deposition Rate (Å/minute) |
|---|---|---|---|
| 77 | 20 | 12 | 240 |
| 78 | 40 | 19 | 285 |
| 79 | 60 | 25 | 343 |
| 80 | 80 | 30 | 413 |

Examples 81-86

A series of films was deposited under the conditions described above for Examples 77-80 under the flow rate conditions shown in Table 9 below, except that the germane concentration in the H₂ was 1.5% and the H₂ flow rate was 30 slm. The Ge concentrations in the resulting films and the deposition rates were determined as described above for Examples 40-48. The Ge concentration and deposition rate data are shown in Table 9 below and plotted in FIG. 10.

TABLE 9

| No. | GeH₄ Flow Rate (slm) | Atomic % Ge in Film | Deposition Rate (Å/minute) |
|---|---|---|---|
| 81 | 20 | 2.2 | 140 |
| 82 | 40 | 4 | 145 |
| 83 | 60 | 6 | 145 |
| 84 | 80 | 7.5 | 148 |
| 85 | 100 | 8 | 163 |
| 86 | 120 | 9 | 171 |

Like FIG. 9, FIG. 10 also shows that the amount of Ge incorporated into the film and the deposition rate are both substantially linear functions of the germane flow rate. FIG. 10 demonstrates that this substantial linearity is not limited to the deposition conditions of Examples 77-80, but can also be achieved under other deposition conditions.

Example 87

Figure 11:
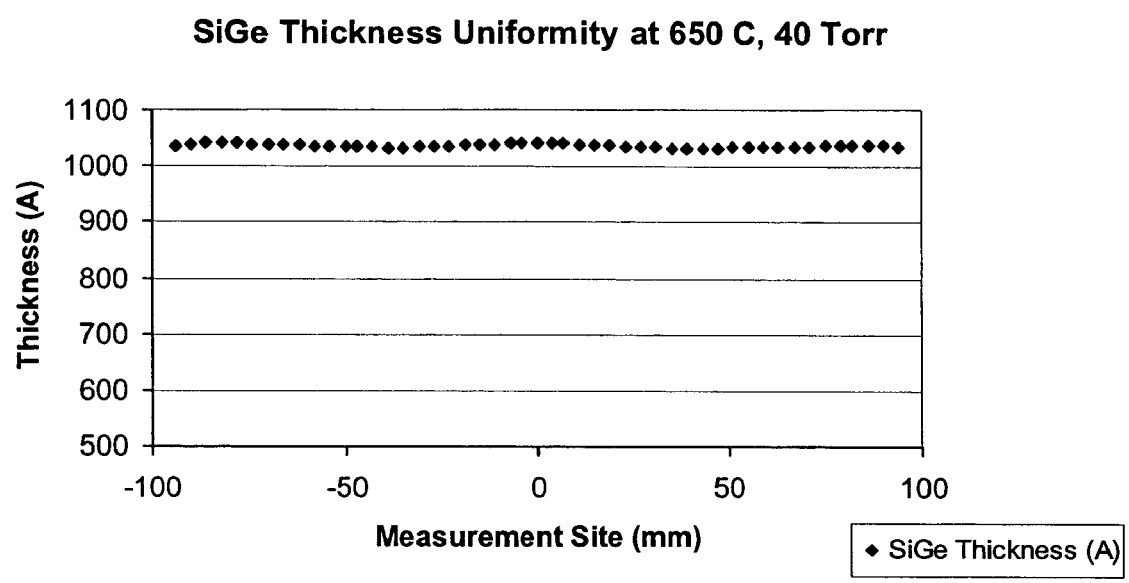
FIG. 11 shows a plot of film thickness as a function of measurement site across a substrate for a preferred SiGe film.
Figure 12:
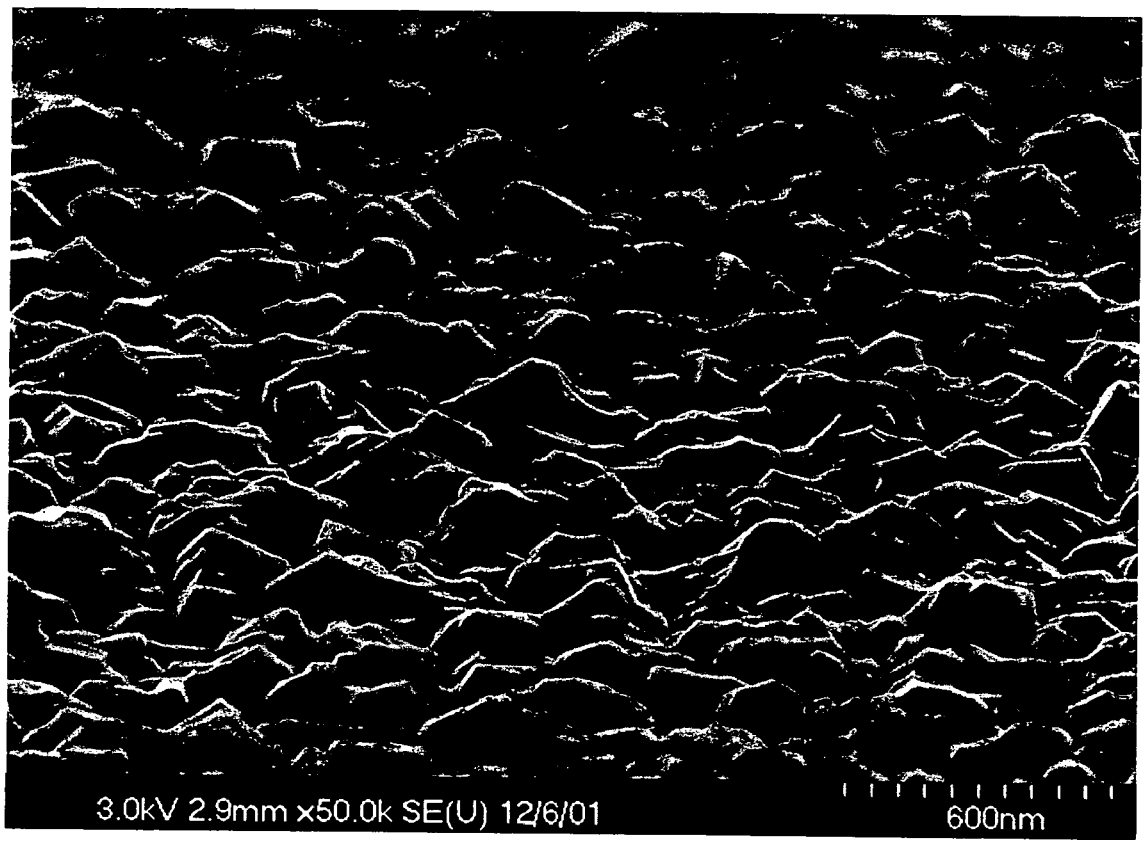
FIG. 12 is a reproduction of a scanning electron photomicrograph illustrating a SiGe film deposited using silane and germane.
Figure 13:
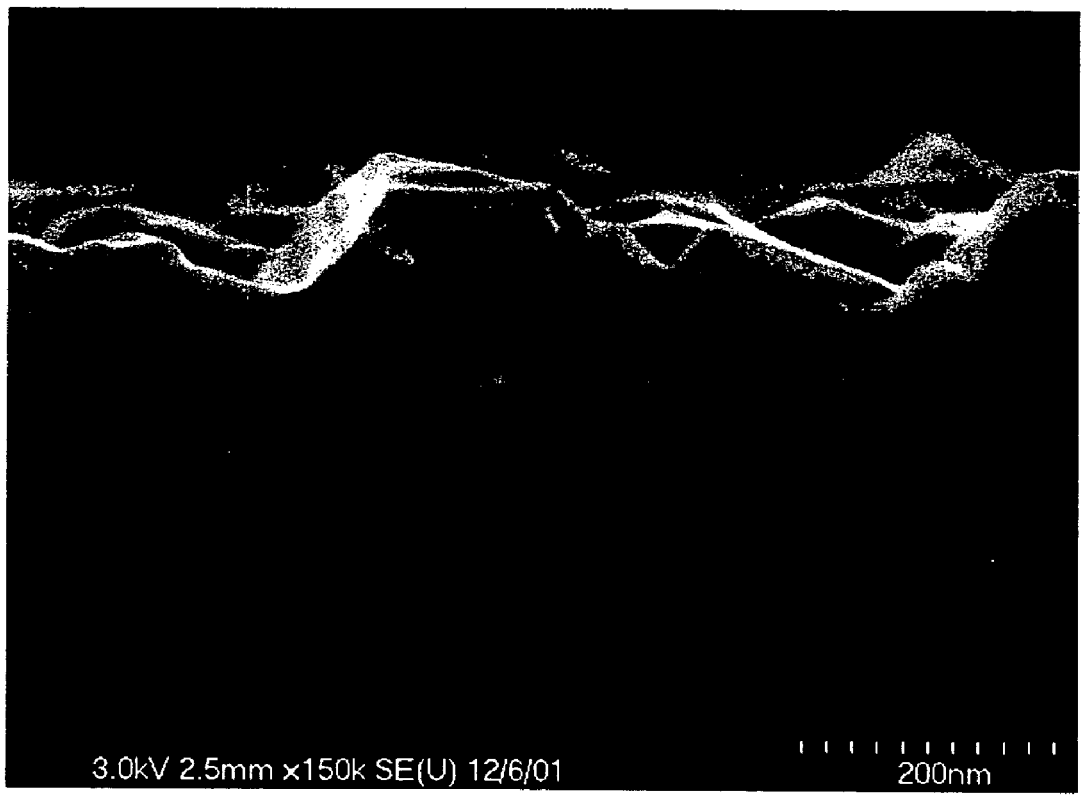
FIG. 13 is a reproduction of a scanning electron photomicrograph illustrating a cross section of the SiGe film shown in FIG. 12.
Figure 14:
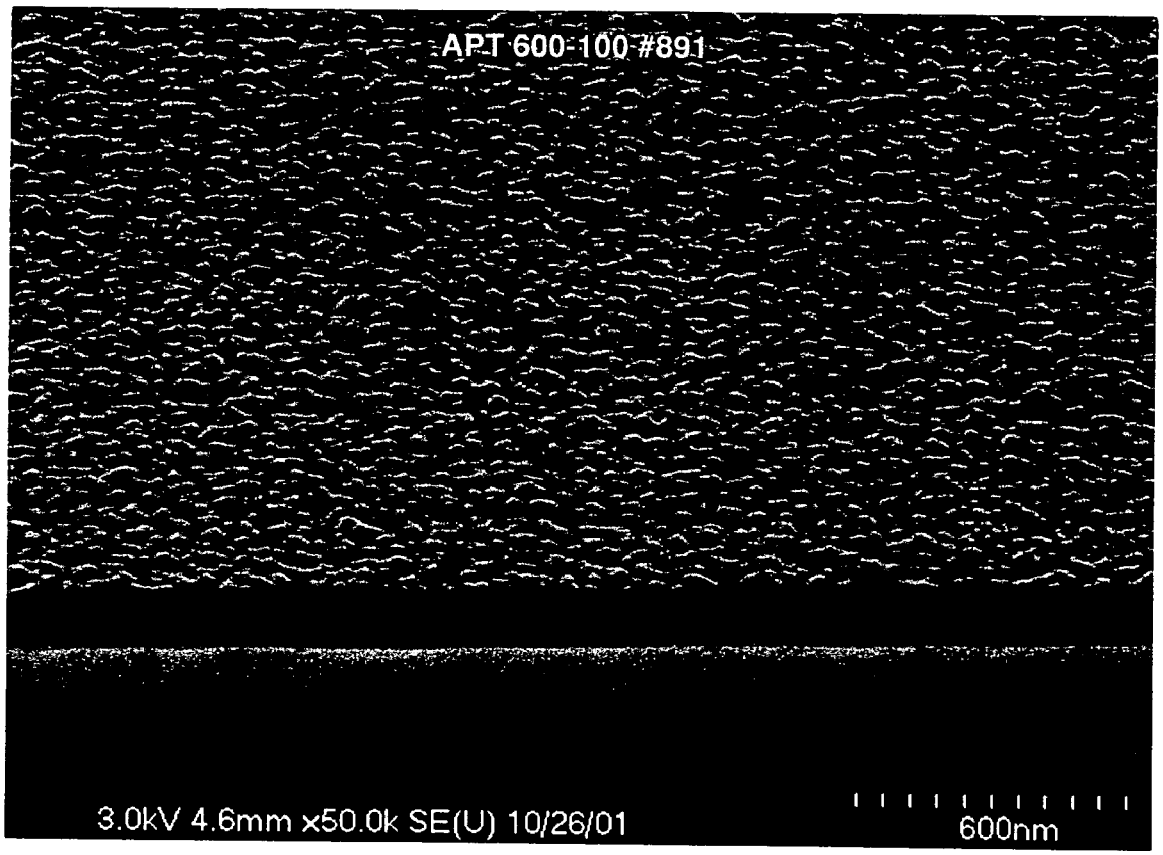
FIG. 14 is a reproduction of a scanning electron photomicrograph showing a SiGe film deposited using trisilane and germane.
Figure 15:
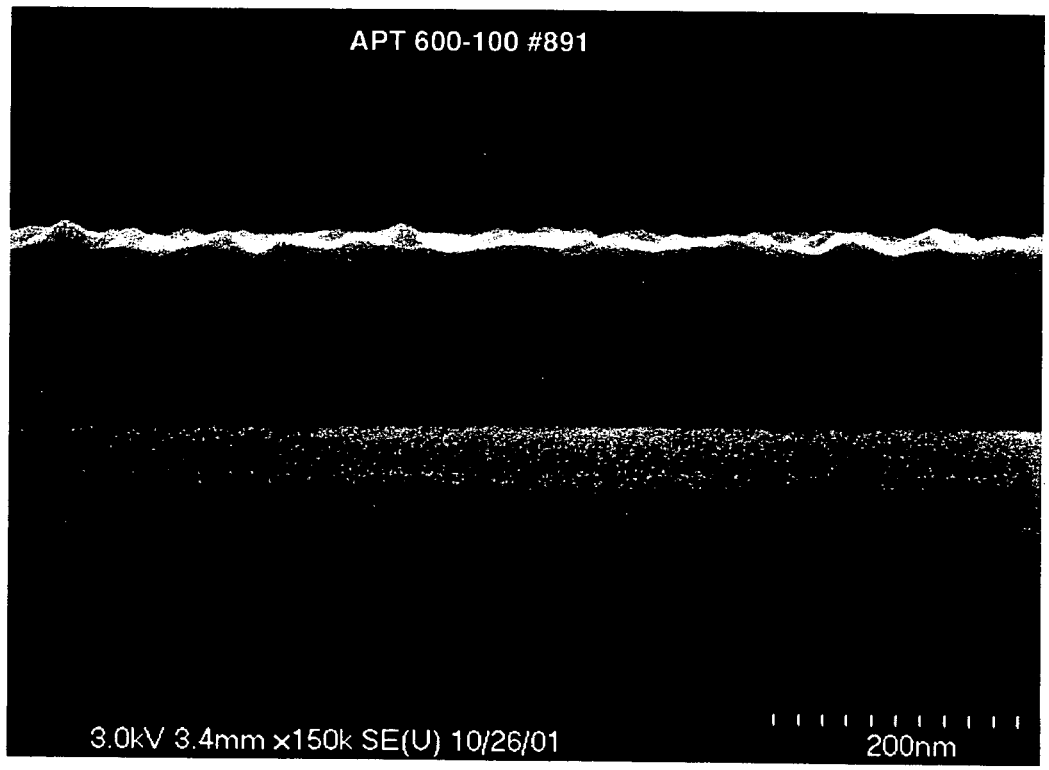
FIG. 15 is a reproduction of a scanning electron photomicrograph showing a cross section of the SiGe film shown in FIG. 14.

A Si-containing film having a mean thickness of 1,038 Å was deposited onto a SiO₂ substrate (without a nucleation layer) using trisilane and germane as chemical precursors at a deposition temperature of 650° C. and a pressure of 40 torr. The set points for gas flow injectors had been empirically tuned in the usual manner in a series of previous runs. The resulting SiGe film had a thickness non-uniformity of 0.37% (range of 8 Å) as measured by a 49 point linear diameter scan with 6 mm edge exclusion. FIG. 11 is a plot of film thickness as a function of measurement site for this film.

Example 88 (Comparative)

A SiGe-containing film was deposited onto a SiO₂ substrate (without a nucleation layer) at a temperature of 600° C. using silane and germane as precursors. The surface roughness of the resulting SiGe film (as measured by atomic force microscopy) was 226 Å for a 10 micron×10 micron scan area. Scanning electron microscopy (SEM) of the SiGe film revealed pyramidal, faceted grains indicative of an island-type deposition, as demonstrated in the SEM micrographs shown in FIGS. 12 and 13.

Example 89

A SiGe-containing film was deposited at 600° C. as described in Example 88, but trisilane and germane were used in place of silane and germane as precursors. The surface roughness of the resulting SiGe film (as measured by atomic force microscopy) was 18.4 Å for a 10 micron×10 micron scan area. SEM of the SiGe film revealed a much more uniform surface, as demonstrated in the SEM micrographs shown in FIGS. 14 and 15 (same magnifications and tilt angles as FIGS. 12 and 13, respectively).

Examples 90-110

A series of Si-containing films were deposited onto a SiO₂ substrate (without a nucleation layer) at a pressure of 40 torr using trisilane and germane. The trisilane flow rate was constant at 77 sccm (hydrogen carrier, bubbler) for the examples of Table 9. Germane flow (10% germane, 90% H$_2$) and deposition temperature were varied as shown in Table 9. Germanium concentration (atomic %) and thickness of the resulting SiGe films were determined by RBS, and surface roughness was determined by atomic force microscopy (AFM). The results shown in Table 9 demonstrate that highly uniform films can be prepared over a range of temperatures and flow rate conditions, particularly over a large range of germane concentration. High deposition rates are achieved at relatively low temperatures without sacrificing uniformity.

TABLE 9

| No. | Temp. (° C.) | Germane Flow (sccm) | % Ge | Thickness (Å) | Deposition Rate (Å/min) | Roughness (Å) |
|---|---|---|---|---|---|---|
| 90 | 450 | 25 | 5.0 | 34* | 8.5 | 3.2 |
| 91 | 450 | 50 | 7.5 | 34* | 11 | 4.1 |
| 92 | 450 | 100 | 11 | 59* | 15 | 3.7 |
| 93 | 450 | 100 | 11 | 53* | 13 | nd |
| 94 | 500 | 25 | 6.0 | 190 | 63 | 7.8 |
| 95 | 500 | 50 | 10 | 230 | 77 | 9.1 |
| 96 | 500 | 100 | 13.5 | 290 | 97 | 8.3 |
| 97 | 500 | 100 | 13.5 | 380* | 127 | 7.2 |
| 98 | 550 | 25 | 6.0 | 630 | 315 | 5.2 |
| 99 | 550 | 50 | 9.5 | 670 | 335 | 13.6 |
| 100 | 550 | 100 | 14 | 900 | 450 | 12.1 |
| 101 | 550 | 100 | 14 | 1016 | 508 | 9.4 |
| 102 | 600 | 25 | 7.0 | 1160 | 580 | 8.1 |
| 103 | 600 | 50 | 13 | 1230 | 615 | 25.7 |
| 104 | 600 | 100 | 19 | 1685 | 843 | 31.8 |
| 105 | 650 | 25 | 11 | 630 | 630 | 23.3 |
| 106 | 650 | 50 | 17 | 800 | 800 | 31.5 |
| 107 | 650 | 100 | 27 | 1050 | 1050 | 50.2 |
| 108 | 700 | 25 | 11 | 680 | 680 | 18.1 |
| 109 | 700 | 50 | 18 | 835 | 835 | 37.8 |
| 110 | 700 | 100 | 31 | 960 | 960 | 44.9 |

*Thickness measured by optical technique
nd: not determined

It will be appreciated by those skilled in the art that various omissions, additions and modifications may be made to the processes described above without departing from the scope of the invention, and all such modifications and changes are intended to fall within the scope of the invention, as defined by the appended claims.

I claim:

1. A SiGe film in an integrated circuit,
wherein the integrated circuit comprises a transistor,
wherein the transistor comprises at least one electrode comprising a plurality of films over a substrate,
wherein the plurality of films comprises the SiGe film,
wherein the SiGe film directly overlies a gate dielectric,
wherein the SiGe film has a compositional non-uniformity of about 22% or less, and
wherein the SiGe film has an as-deposited thickness non-uniformity of less than 5%.

2. The SiGe film as claimed in claim 1, wherein the SiGe film is contained in a transistor gate electrode.

3. The SiGe film as claimed in claim 1, wherein the gate dielectric has a dielectric constant greater than 5.

4. The SiGe film as claimed in claim 1, wherein the gate dielectric has a dielectric constant greater than 10.

5. The SiGe film as claimed in claim 1, wherein the gate dielectric comprises a material selected from the group consisting of aluminum oxide, hafnium oxide and zirconium oxide.

6. The SiGe film as claimed in claim 1, the SiGe film having an as-deposited thickness non-uniformity of about 2% or less.

7. The SiGe film as claimed in claim 1, wherein the SiGe film is contained in a heterojunction bipolar transistor.

8. A SiGe film in an integrated circuit, the SiGe film having an as-deposited thickness non-uniformity of less than 5%, wherein the SiGe film is graded and has a compositional non-uniformity of less than 22% across a plane of the SiGe film.

9. The SiGe film as claimed in claim 8, wherein the SiGe film comprises a central portion having a substantially constant Ge concentration, the central portion being sandwiched between graded portions in which the Ge concentration varies.

10. The SiGe film as claimed in claim 1, the SiGe film having a compositional non-uniformity of about 17% or less.

11. The SiGe film as claimed in claim 1, the SiGe film having a compositional non-uniformity of about 12% or less.

12. A SiGe film in an integrated circuit, the SiGe film having an as-deposited thickness non-uniformity of less than 5%, and the SiGe film having a compositional non-uniformity of less than about 10%.

13. The SiGe film as claimed in claim 1, wherein the SiGe film is amorphous.

14. The SiGe film as claimed in claim 1, wherein the SiGe film is epitaxial.

15. The SiGe film as claimed in claim 1, wherein the SiGe film is polycrystalline.

* * * * *

UNITED STATES PATENT AND TRADEMARK OFFICE
CERTIFICATE OF CORRECTION

| | | |
|---|---|---|
| PATENT NO. | : 8,067,297 B2 | Page 1 of 1 |
| APPLICATION NO. | : 11/642167 | |
| DATED | : November 29, 2011 | |
| INVENTOR(S) | : Michael A. Todd | |

It is certified that error appears in the above-identified patent and that said Letters Patent is hereby corrected as shown below:

Title page (item 60), under "Related U.S. Application Data", line 12, please replace "Jul. 28, 2011" with -- Nov. 28, 2011 --

Signed and Sealed this
Seventeenth Day of April, 2012

David J. Kappos
*Director of the United States Patent and Trademark Office*